US012751115B2

(12) United States Patent
Park et al.

(10) Patent No.: US 12,751,115 B2

(45) Date of Patent: Sep. 29, 2026

(54) DISPLAY DEVICE AND METHOD OF MANUFACTURING THE SAME

(71) Applicant: Samsung Display Co., LTD., Yongin-si (KR)

(72) Inventors: No Kyung Park, Yongin-si (KR); Kyung Bae Kim, Yongin-si (KR); Do Yeong Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 695 days.

(21) Appl. No.: 18/086,008

(22) Filed: Dec. 21, 2022

(65) Prior Publication Data

US 2023/0246136 A1 Aug. 3, 2023

(30) Foreign Application Priority Data

Jan. 28, 2022 (KR) ........................ 10-2022-0013709

(51) Int. Cl.

*H10H 20/831* (2025.01)
*H10H 20/01* (2025.01)
*H10H 20/819* (2025.01)
*H10H 20/857* (2025.01)

(52) U.S. Cl.

CPC ........ *H10H 20/8312* (2025.01); *H10H 20/01* (2025.01); *H10H 20/819* (2025.01); *H10H 20/857* (2025.01); *H10H 20/032* (2025.01); *H10H 20/0364* (2025.01)

(58) Field of Classification Search

CPC ... H10H 20/00–882; H10H 29/00–142; H10H 29/30–962; H10K 50/00–88; H10K 59/00–95; H10K 65/00; H10K 71/00–861; H10K 85/00–791; H10K 2101/00–90; H10K 2102/00–361; B32B 2457/206

See application file for complete search history.

(56) References Cited

U.S. PATENT DOCUMENTS

| | | | | |
|---|---|---|---|---|
| 11,647,649 | B2 * | 5/2023 | Kim | H10K 59/122 257/40 |
| 11,916,171 | B2 | 2/2024 | Lee et al. | |
| 12,100,728 | B2 | 9/2024 | Kwag et al. | |
| 2021/0280753 | A1 | 9/2021 | Kim et al. | |
| 2021/0375194 | A1 * | 12/2021 | Kwag | G09G 3/32 |
| 2022/0013509 | A1 * | 1/2022 | Lee | H10W 90/00 |

FOREIGN PATENT DOCUMENTS

| | | | |
|---|---|---|---|
| KR | 10-2020-0005711 | | 1/2020 |
| KR | 10-2020-0042075 | | 4/2020 |
| KR | 10-2020-0042997 | A | 4/2020 |
| KR | 10-2021-0146767 | A | 12/2021 |
| WO | 2021-091061 | | 5/2021 |

* cited by examiner

*Primary Examiner* — Christine S. Kim
*Assistant Examiner* — Cole Leon Lindsey
(74) *Attorney, Agent, or Firm* — Womble Bond Dickinson (US) LLP

(57) ABSTRACT

Provided herein is a display device and a method of manufacturing the same. The display device includes electrodes spaced apart from each other, a first insulating layer disposed on the electrodes and including a first opening, a light-emitting element disposed on the first insulating layer and disposed between adjacent ones of the electrodes, and organic patterns disposed between adjacent ones of the electrodes in the first opening.

8 Claims, 24 Drawing Sheets

DISPLAY DEVICE AND METHOD OF MANUFACTURING THE SAME

CROSS-REFERENCE TO RELATED APPLICATION(S)

This application claims priority to and benefit of Korean patent application number 10-2022-0013709 under 35 U.S.C. § 119, filed on Jan. 28, 2022, the disclosure of which is incorporated by reference herein in its entirety.

BACKGROUND

1. Technical Field

The disclosure relates to a display device and a method of manufacturing the display device.

2. Description of the Related Art

Recently, as interest in information display has increased, research into and development of display devices has been continuously conducted.

SUMMARY

Various embodiments of the disclosure are directed to a display device and a method of manufacturing the display device, which may prevent short-circuit failures in electrodes, and may simplify a manufacturing process.

The objects of the disclosure are not limited to the above-described objects, and other objects, not described here, may be clearly understood by those skilled in the art from the following description.

An embodiment of the disclosure may provide a display device. The display device may include electrodes spaced apart from each other, a first insulating layer disposed on the electrodes and including a first opening, a light-emitting element disposed on the first insulating layer and disposed between adjacent ones of the electrodes, and organic patterns disposed between adjacent ones of the electrodes in the first opening.

The display device may further include a second insulating layer disposed on the light-emitting element and including a second opening overlapping the first opening in a plan view.

The organic patterns may be spaced apart from each other in a first direction in the second opening.

Each of the organic patterns may extend in a second direction intersecting the first direction.

The second opening may be offset from the electrodes in a plan view.

The display device may further include an insulating pattern disposed on the second insulating layer and overlapping the light-emitting element in a plan view.

The organic patterns and the insulating pattern may include a same material.

The insulating pattern may expose a first end and a second end of the light-emitting element.

The display device may further include a first connection electrode disposed on the first end of the light-emitting element, and a second connection electrode disposed on the second end of the light-emitting element.

The first connection electrode and the second connection electrode may be disposed on a same layer.

An embodiment of the disclosure may provide a method of manufacturing a display device. The method may include forming a first insulating layer on electrodes spaced apart from each other, forming a first opening to partially expose the electrodes by etching a portion of the first insulating layer, disposing at least one light-emitting element between adjacent ones of the electrodes, forming a second insulating layer on the electrodes and the at least one light-emitting element, forming a second opening overlapping the first opening in a plan view by etching a portion of the second insulating layer, and forming organic patterns between adjacent ones of the electrodes in the second opening.

Adjacent ones of the organic patterns may be spaced apart from each other with at least one of the electrodes disposed between the adjacent ones of the organic patterns.

The organic patterns may be spaced apart from each other in a first direction in the first opening.

Each of the organic patterns may extend in a second direction intersecting the first direction.

The method may further include removing the electrodes in the second opening.

The method may further include forming an insulating pattern on the second insulating layer after the etching of the portion of the second insulating layer, wherein the insulating pattern overlaps the at least one light-emitting element in a plan view.

The organic patterns and the insulating pattern may be simultaneously formed.

The method may further include forming a connection electrode layer on at least one of the at least one light-emitting element, the insulating pattern, and the organic patterns.

The method may further include partially removing the connection electrode layer on at least one of the insulating pattern and the organic patterns.

The connection electrode layer may be separated into a first connection electrode disposed on a first end of the at least one light-emitting element and a second connection electrode disposed on a second end of the at least one light-emitting element.

Other detailed matters of the embodiments are included in the detailed description and the drawings.

DETAILED DESCRIPTION OF THE EMBODIMENTS

Figure 1:
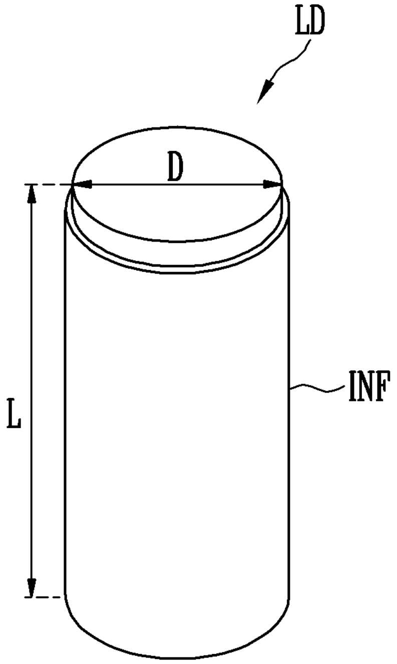
FIG. 1 is a perspective view illustrating a light-emitting element according to an embodiment.

Advantages and features of the disclosure and methods for achieving the same will be clarified with reference to embodiments described in detail together with the accompanying drawings. The disclosure is not limited to the following embodiments, and may be implemented in various forms. The embodiments of the disclosure are intended to fully describe the disclosure to those skilled in the art to which the disclosure pertains, and the disclosure should be defined by the scope of the accompanying claims.

The terms used in the specification are merely intended to describe the embodiments, and are not intended to limit the disclosure. The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Also, the term "coupling" or "connection" may comprehensively refer to physical and/or electrical coupling or connection. In addition, the term "coupling" or "connection" may comprehensively refer to direct or indirect coupling or connection and integral or non-integral coupling or connection.

Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Although terms such as "first" and "second" may be used to describe various components, it will be apparent that those components are not limited by the terms. These terms are merely used to distinguish one component from another component. Therefore, it is apparent that a first component may also be termed a second component without departing from the technical spirit of the disclosure.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the attached drawings.

Figure 2:
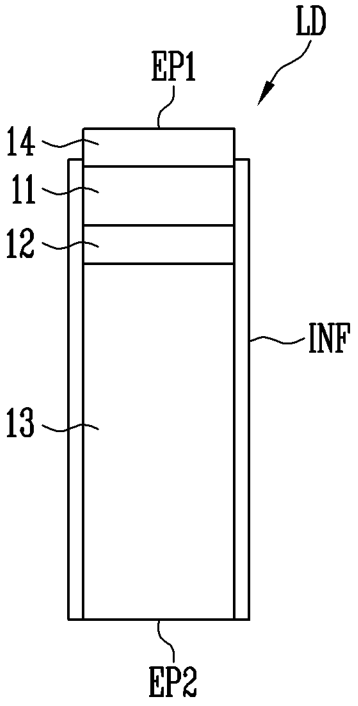
FIG. 2 is a schematic cross-sectional view illustrating a light-emitting element according to an embodiment.

FIG. 1 is a perspective view illustrating a light-emitting element according to an embodiment. FIG. 2 is a schematic cross-sectional view illustrating a light-emitting element according to an embodiment. Although, in FIGS. 1 and 2, a pillar-shaped light-emitting element LD is illustrated, the type and/or shape of the light-emitting element LD are not limited thereto.

Referring to FIGS. 1 and 2, the light-emitting element LD may include a first semiconductor layer 11, an active layer 12, a second semiconductor layer 13, and/or an electrode layer 14.

The light-emitting element LD may be formed in the shape of a pillar extending in one direction. The light-emitting element LD may have a first end EP1 and a second end EP2. One of the first and second semiconductor layers 11 and 13 may be arranged on the first end EP1 of the light-emitting element LD. The other of the first and second semiconductor layers 11 and 13 may be arranged on the second end EP2 of the light-emitting element LD. For example, the first semiconductor layer 11 may be arranged on the first end EP1 of the light-emitting element LD, and the second semiconductor layer 13 may be arranged on the second end EP2 of the light-emitting element LD.

In accordance with an embodiment, the light-emitting element LD may be a light-emitting element manufactured in the shape of a pillar through an etching method or the like. In this specification, the term "pillar shape" may include a rod-like shape or a bar-like shape such as a cylindrical shape or a prismatic shape having an aspect ratio greater than 1, and the cross-sectional shape thereof may be not limited to any particular shape.

The light-emitting element LD may have a small size ranging from a nanometer scale to a micrometer scale. For example, the light-emitting element LD may have a diameter D (or width) and/or a length L ranging from a nanometer scale to a micrometer scale. However, the size of the light-emitting element LD is not limited thereto, and may be variously changed depending on the design conditions for various types of devices, for example, display devices and the like that employ a light-emitting device using the light-emitting element LD as a light source.

The first semiconductor layer 11 may be a first conductive semiconductor layer. For example, the first semiconductor layer 11 may include a P-type semiconductor layer. For instance, the first semiconductor layer 11 may include a P-type semiconductor layer, which includes a semiconductor material including at least one of InAlGaN, GaN, AlGaN, InGaN, and AlN and may be doped with a first conductive dopant such as Mg. However, the material forming the first semiconductor layer 11 is not limited thereto, and various types of other materials may be used to form the first semiconductor layer 11.

The active layer 12 may be disposed between the first semiconductor layer 11 and the second semiconductor layer 13. The active layer 12 may include, but is not limited to, any one of a single-well structure, a multi-well structure, a single quantum well structure, a multi-quantum well (MQW) structure, a quantum dot structure, and a quantum wire structure. The active layer 12 may include GaN, InGaN, InAlGaN, AlGaN, or AlN, and various types of other materials may be used to form the active layer 12.

In case that a voltage equal to or greater than a threshold voltage is applied to both ends of the light-emitting element LD, the light-emitting element LD may emit light while electrons and holes are coupled to each other to form electron-hole pairs in the active layer 12. Since light emission by the light-emitting element LD is controlled based on the foregoing principle, the light-emitting element LD may be used as a light source of various light-emitting devices as well as pixels of the display device.

The second semiconductor layer 13 may be disposed on the active layer 12, and may include a semiconductor layer of a type different from that of the first semiconductor layer 11. The second semiconductor layer 13 may include an N-type semiconductor layer. For instance, the second semiconductor layer 13 may include an N-type semiconductor layer which includes a semiconductor material corresponding to any one of InAlGaN, GaN, AlGaN, InGaN, and AlN and may be doped with a second conductive dopant such as Si, Ge, or Sn. However, the material forming the second semiconductor layer 13 is not limited thereto, and various types of other materials may be used to form the second semiconductor layer 13.

The electrode layer 14 may be disposed on the first end EP1 and/or the second end EP2 of the light-emitting element LD. Although the case where the electrode layer 14 is formed on the first semiconductor layer 11 is illustrated by way of example, the disclosure is not limited thereto. For example, a separate electrode layer may be further disposed on the second end EP2.

The electrode layer 14 may include a transparent metal or a transparent metal oxide. For example, the electrode layer 14 may include, but is not limited to, at least one of indium tin oxide (ITO), indium zinc oxide (IZO), and zinc tin oxide (TZO). In this way, in case that the electrode layer 14 is made of transparent metal or transparent metal oxide, light generated from the active layer 12 of the light-emitting element LD may be emitted outside the light-emitting element LD after passing through the electrode layer 14.

An insulating layer INF may be provided on the surface of the light-emitting element LD. The insulating layer INF may be directly disposed on the surfaces of the first semiconductor layer 11, the active layer 12, the second semiconductor layer 13, and/or the electrode layer 14. The insulating layer INF may expose the first and second ends EP1 and EP2 of the light-emitting element LD having different polarities. In accordance with an embodiment, the insulating layer INF may expose at least a portion of the electrode layer 14 and/or at least side portions of the second semiconductor layer 13, which are adjacent to the first and second ends EP1 and EP2 of the light-emitting element LD.

The insulating layer INF may prevent an electrical short-circuit from occurring in case that the active layer 12 contacts a conductive material other than the first and second semiconductor layers 11 and 13. Also, the insulating layer INF may improve the lifetime and emission efficiency of light-emitting elements LD by minimizing surface defects of the light-emitting elements LD.

The insulating layer INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). For example, the insulating layer INF may be implemented as a double-layer structure, and the individual layers forming the double-layer structure may include different types of materials. In an embodiment, the insulating layer INF may be implemented as, but is not limited to, a double-layer structure composed of aluminum oxide (AlOx) and silicon oxide (SiOx). In another embodiment, the insulating layer INF may be omitted.

A light-emitting device including the above-described light-emitting element LD may be used in various types of devices requiring a light source, as well as in a display device. For example, the light-emitting elements LD may be arranged in respective pixels of a display panel, and may be used as light sources for respective pixels. However, the field of application of the light-emitting elements LD is not limited to the above-described examples. For example, the light-emitting elements LD may also be used in other types of devices requiring a light source, such as a lighting device.

Figure 3:
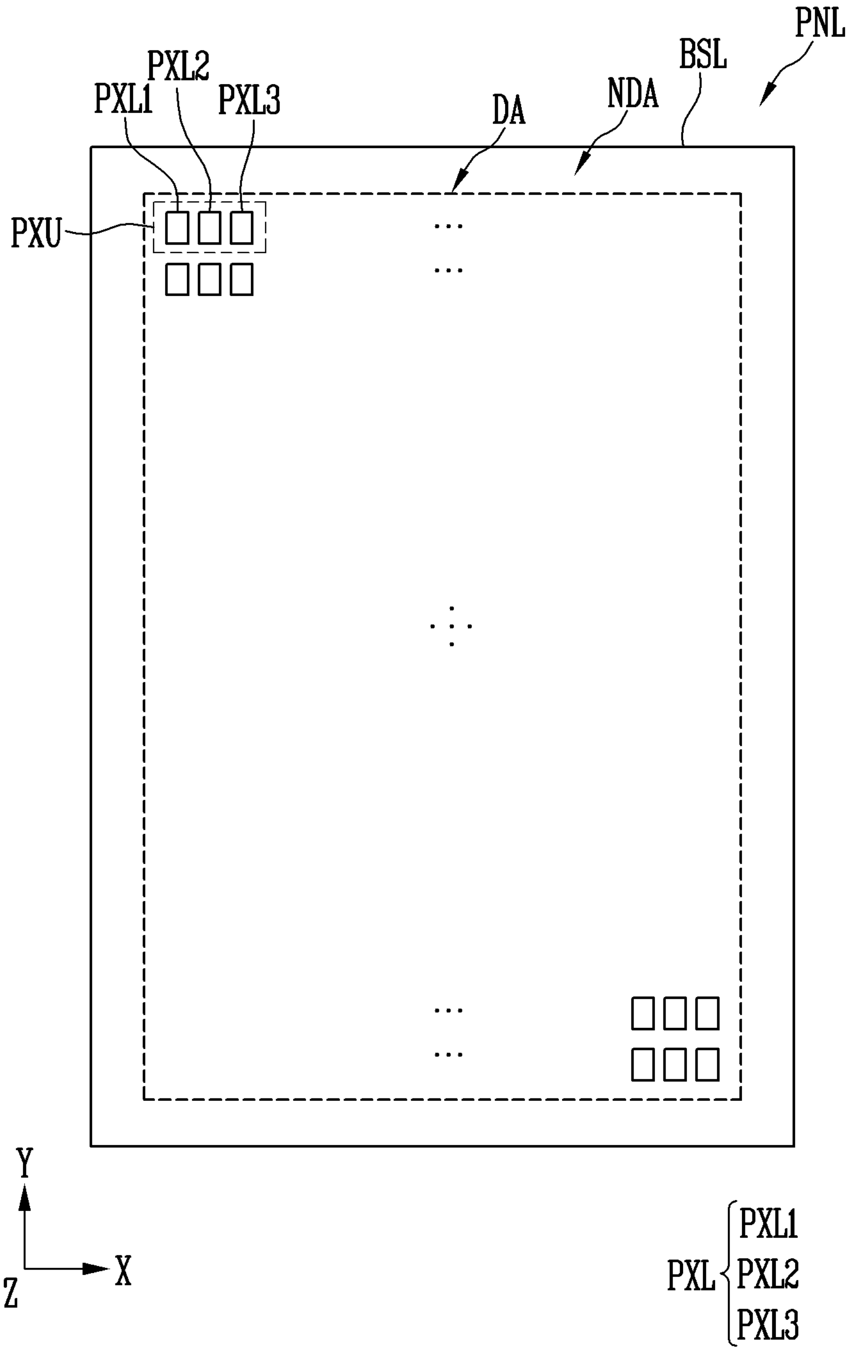
FIG. 3 is a plan view illustrating a display device according to an embodiment.

FIG. 3 is a plan view illustrating a display device according to an embodiment.

In FIG. 3, a display device, especially a display panel PNL provided in the display device, is illustrated as an embodiment of the electronic device, which may use the light-emitting element LD, described above with reference to the embodiments of FIGS. 1 and 2, as a light source.

For convenience of description, the structure of the display panel PNL, focusing on a display area DA, is schematically illustrated in FIG. 3. However, in some embodiments, at least one driving circuit (e.g., at least one of a scan driver and a data driver), which is not illustrated, lines and/or pads may be further disposed on the display panel PNL.

Referring to FIG. 3, the display panel PNL and a base layer BSL used to form the display panel PNL may include a display area DA in which an image is displayed, and a non-display area NDA other than the display area DA. The display area DA may form a screen in which an image is displayed, and the non-display area NDA may be the remaining area excluding the display area DA.

In the display area DA, a pixel group PXU may be disposed. The pixel group PXU may include a first pixel PXL1, a second pixel PXL2, and/or a third pixel PXL3. Hereinafter, in case that at least one of the first pixel PXL1, the second pixel PXL2, and the third pixel PXL3 is arbitrarily designated, or in case that two or more types of pixels are comprehensively designated, the pixel or pixels may be referred to as "pixel PXL" or "pixels PXL."

The pixels PXL may be regularly arranged depending on the stripe or PenTile™ array structure or the like. However, the array structure of the pixels PXL is not limited thereto, and the pixels PXL may be arranged in the display area DA in various structures and/or manners.

In accordance with an embodiment, two or more types of pixels PXL which emit light of different colors may be arranged in the display area DA. In an embodiment, first pixels PXL1, which emit light of a first color, second pixels PXL2, which emit light of a second color, and third pixels PXL3, which emit light of a third color, may be arranged in the display area DA. One or more first to third pixels PXL1, PXL2, and PXL3, which are arranged adjacent to each other, may form a single pixel part PXL capable of emitting light of various colors. For example, each of the first to third pixels PXL1, PXL2, and PXL3 may be a pixel which emits light of a certain color. In an embodiment, the first pixel PXL1 may be a red pixel which emits red light, the second pixel PXL2 may be a green pixel which emits green light, and the third pixel PXL3 may be a blue pixel which emits blue light, but the pixels of the disclosure are not limited thereto.

In an embodiment, the first pixel PXL1, the second pixel PXL2, and the third pixel PXL3 may be provided with light-emitting elements which emit light of the same color, but the pixels may include color conversion layers and/or color filter layers corresponding to different colors, which are disposed on respective light-emitting elements, thus emitting light of a first color, light of a second color, and light of a third color. In other embodiments, the first pixel PXL1, the second pixel PXL2, and the third pixel PXL3 may be provided with a light-emitting element of a first color, a light-emitting element of a second color, and a light-emitting element of a third color, respectively, as light sources, thus respectively emitting light of the first color, light of the second color, and light of the third color. However, the colors, types, and/or number of pixels PXL constituting each pixel PXL are not particularly limited. For example, the color of light emitted from each pixel PXL may be variously changed.

Each pixel PXL may include at least one light source that is driven in response to a control signal (e.g., a scan signal and a data signal) and/or power (e.g., first power and second power). In an embodiment, the light source may include at least one light-emitting element LD according to any one of the embodiments in FIGS. 1 and 2, e.g., subminiature pillar-shaped light-emitting elements LD having a small size ranging from a nanometer scale to a micrometer scale. However, the light source is not limited thereto, and various additional types of light-emitting elements LD may be used as a light source of each pixel PXL.

In an embodiment, respective pixels PXL may be implemented as active pixels. However, the types, structures, and/or driving schemes of the pixels PXL applicable to the display device are not particularly limited. For example, respective pixels PXL having various structures and/or driving schemes may be implemented as pixels of passive or active light-emitting display devices.

Figure 4:
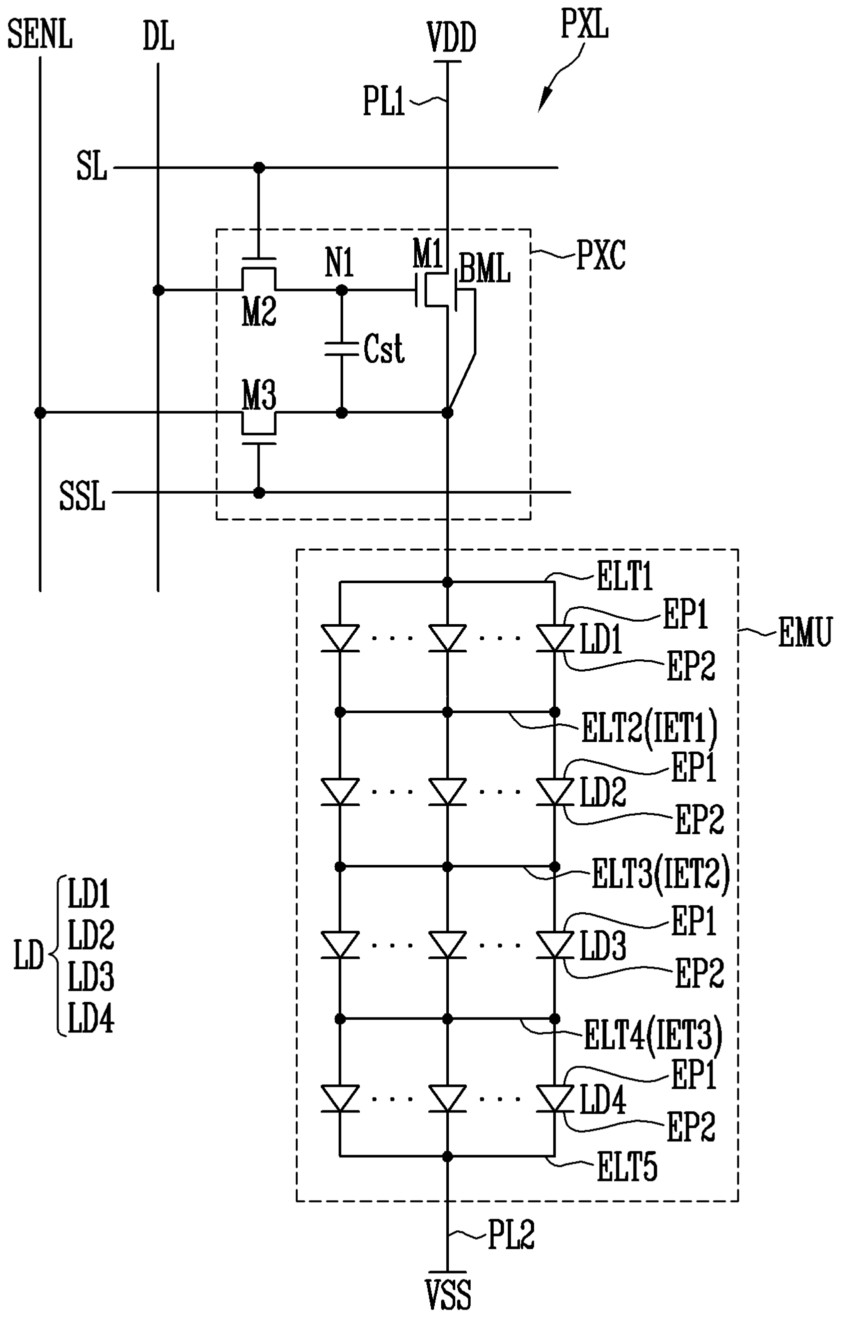
FIG. 4 is a schematic diagram of an equivalent circuit of a pixel according to an embodiment.

FIG. 4 is a schematic diagram of an equivalent circuit of a pixel according to an embodiment.

In an embodiment, the pixel PXL illustrated in FIG. 4 may be any one of the first pixel PXL1, the second pixel PXL2, and the third pixel PXL3 provided on the display panel PNL of FIG. 3. The first pixel PXL1, the second pixel PXL2, and the third pixel PXL3 may have structures substantially identical or similar to each other.

Referring to FIG. 4, each pixel PXL may further include an emission part EMU, which generates light with a luminance corresponding to a data signal, and a pixel circuit PXC which drives the emission part EMU.

The pixel circuit PXC may be electrically connected between a source of first power VDD and the emission part EMU. Further, the pixel circuit PXC may be electrically connected to a scan line SL and a data line DL of the corresponding pixel PXL, and may then control the operation of the emission part EMU in response to a scan signal and a data signal that are supplied from the scan line SL and the data line DL. Also, the pixel circuit PXC may be further selectively electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be electrically connected between the source of the first power VDD and a first connection electrode ELT1. A gate electrode of the first transistor M1 may be electrically connected to a first node N1. The first transistor M1 may control a driving current that is supplied to the emission part EMU in response to the voltage of the first node N1. For example, the first transistor M1 may be a driving transistor which controls a driving current of the pixel PXL.

In an embodiment, the first transistor M1 may selectively include a lower conductive layer BML (hereinafter also referred to as a "lower electrode", "back-gate electrode" or "lower light blocking layer"). The gate electrode of the first transistor M1 and the lower conductive layer BML may overlap each other with an insulating layer interposed therebetween. In an embodiment, the lower conductive layer BML may be electrically connected to a first electrode of the first transistor M1, for example, a source or drain electrode.

In case that the first transistor M1 includes the lower conductive layer BML, back-biasing technology (or "sync" technology) of moving the threshold voltage of the first transistor M1 in a negative or positive direction by applying a back-bias voltage to the lower conductive layer BML of the first transistor M1 may be applied when the pixel PXL is driven. In an embodiment, source-sink technology may be applied to the first transistor M1 by electrically connecting the lower conductive layer BML to the source electrode of the first transistor M1, and thus the threshold voltage of the first transistor M1 may be moved in a negative or positive direction. Further, in case that the lower conductive layer BML is disposed under a semiconductor pattern forming the channel of the first transistor M1, the operating characteristics of the first transistor M1 may be stabilized while the lower conductive layer BML functions as a light blocking pattern. However, the functions and/or the utilizing schemes of the lower conductive layer BML are not limited thereto.

The second transistor M2 may be electrically connected between the data line DL and the first node N1. Further, a gate electrode of the second transistor M2 may be electrically connected to a scan line SL. The second transistor M2 may be turned on when a scan signal having a gate-on voltage (e.g., a high level voltage) is supplied from the scan line SL, thus electrically connecting the data line DL and the first node N1 to each other.

In each frame period, the data signal for the corresponding frame may be supplied to the data line DL, and may be transferred to the first node N1 through the turned-on second transistor M2 during a period in which the scan signal having a gate-on voltage is supplied. For example, the second transistor M2 may be a switching transistor for transferring each data signal into the pixel PXL.

A first electrode of the storage capacitor Cst may be electrically connected to the first node N1, and a second electrode thereof may be electrically connected to a second electrode of the first transistor M1. The storage capacitor Cst may charge a voltage corresponding to the data signal supplied to the first node N1 during each frame period.

The third transistor M3 may be electrically connected between the first connection electrode ELT1 (or the second electrode of the first transistor M1) and the sensing line SENL. A gate electrode of the third transistor M3 may be electrically connected to the sensing signal line SSL. The third transistor M3 may transfer a voltage value, applied to the first connection electrode ELT1, to the sensing line SENL in response to the sensing signal supplied to the sensing signal line SSL. The voltage value transferred through the sensing line SENL may be provided to an external circuit (e.g., a timing controller), and the external circuit may extract characteristic information of each pixel PXL (e.g., the threshold voltage or the like of the first transistor M1) based on the provided voltage value. The extracted characteristic information may be used to convert image data so that deviations between the characteristics of the pixels PXL are compensated for.

Although, in FIG. 4, all of the transistors included in the pixel circuit PXC are illustrated as N-type transistors, the transistors are not limited thereto. For example, at least one of the first, second, and third transistors M1, M2, and M3 may be replaced with a P-type transistor.

Furthermore, the structure and driving scheme of the pixel PXL may be changed in various manners. For example, the pixel circuit PXC may be implemented as pixel circuits having various structures and/or driving schemes, in addition to the embodiment illustrated in FIG. 4.

In an embodiment, the pixel circuit PXC may not include the third transistor M3. Also, the pixel circuit PXC may further include additional circuit elements, such as a compensation transistor for compensating the threshold voltage or the like of the first transistor M1, an initialization transistor for initializing the voltages of the first node N1 and/or the first connection electrode ELT1, an emission control transistor for controlling the period during which a driving current is supplied to the emission part EMU, and/or a boosting capacitor for boosting the voltage of the first node N1.

The emission part EMU may include at least one light-emitting element LD, for example, multiple light-emitting elements LD, electrically connected between the source of the first power VDD and a source of second power VSS.

For example, the emission part EMU may include the first connection electrode ELT1 electrically connected to the source of the first power VDD through the pixel circuit PXC and a first power line PL1, a fifth connection electrode ELT5 electrically connected to the source of the second power VSS through a second power line PL2, and multiple light-emitting elements LD electrically connected between the first and fifth connection electrodes ELT1 and ELT5.

The first power VDD and the second power VSS may have different potentials so that the light-emitting elements LD may emit light. For example, the first power VDD may be high-potential power, and the second power VSS may be low-potential power.

In an embodiment, the emission part EMU may include at least one serial stage. Each serial stage may include a pair of electrodes (e.g., two electrodes) and at least one light-emitting element LD electrically connected in a forward direction between the electrodes forming the pair. Here, the number of serial stages forming the emission part EMU and the number of light-emitting elements LD forming each serial stage are not particularly limited. For example, the numbers of light-emitting elements LD forming respective serial stages may be identical to or different from each other, and the numbers of light-emitting elements LD are not particularly limited.

For example, the emission part EMU may include a first serial stage including at least one first light-emitting element LD1, a second serial stage including at least one second light-emitting element LD2, a third serial stage including at least one third light-emitting element LD3, and a fourth serial stage including at least one fourth light-emitting element LD4.

The first serial stage may include the first connection electrode ELT1, a second connection electrode ELT2, and at least one first light-emitting element LD1 electrically connected between the first and second connection electrodes ELT1 and ELT2. Respective first light-emitting elements LD1 may be electrically connected in a forward direction between the first and second connection electrodes ELT1 and ELT2. For example, a first end EP1 (shown in FIG. 2) of each first light-emitting element LD1 may be electrically connected to the first connection electrode ELT1, and a second end EP2 (shown in FIG. 2) thereof may be electrically connected to the second connection electrode ELT2.

The second serial stage may include the second connection electrode ELT2, a third connection electrode ELT3, and at least one second light-emitting element LD2 electrically connected between the second and third connection electrodes ELT2 and ELT3. Respective second light-emitting elements LD2 may be electrically connected in a forward direction between the second and third connection electrodes ELT2 and ELT3. For example, a first end EP1 of each second light-emitting element LD2 may be electrically connected to the second connection electrode ELT2, and a second end EP2 thereof may be electrically connected to the third connection electrode ELT3.

The third serial stage may include the third connection electrode ELT3, a fourth connection electrode ELT4, and at least one third light-emitting element LD3 electrically connected between the third and fourth connection electrodes ELT3 and ELT4. Respective third light-emitting elements LD3 may be electrically connected in a forward direction between the third and fourth connection electrodes ELT3 and ELT4. For example, a first end EP1 of each third light-emitting element LD3 may be electrically connected to the third connection electrode ELT3, and a second end EP2 thereof may be electrically connected to the fourth connection electrode ELT4.

The fourth serial stage may include the fourth connection electrode ELT4, a fifth connection electrode ELT5, and at least one fourth light-emitting element LD4 electrically connected between the fourth and fifth connection electrodes ELT4 and ELT5. Respective fourth light-emitting elements LD4 may be electrically connected in a forward direction between the fourth and fifth connection electrodes ELT4 and ELT5. For example, a first end EP1 of each fourth light-emitting element LD4 may be electrically connected to the fourth connection electrode ELT4, and a second end EP2 thereof may be electrically connected to the fifth connection electrode ELT5.

The first electrode of the emission part EMU, for example, the first connection electrode ELT1, may be the anode electrode of the emission part EMU. The last electrode of the emission part EMU, for example, the fifth connection electrode ELT5, may be the cathode electrode of the emission part EMU.

The remaining electrodes of the emission part EMU, for example, the second connection electrode ELT2, the third connection electrode ELT3, and/or the fourth connection electrode ELT4 may form respective intermediate electrodes. For example, the second connection electrode ELT2 may form a first intermediate electrode IET1, the third connection electrode ELT3 may form a second intermediate electrode IET2, and the fourth connection electrode ELT4 may form a third intermediate electrode IET3.

In case that the light-emitting elements LD are electrically connected in a serial-parallel structure, power efficiency may be further improved compared to the case that only an identical number of light-emitting elements LD are electrically connected to each other only in parallel. Also, in the pixel PXL in which the light-emitting elements LD are electrically connected in a serial-parallel structure, even if a short circuit fault occurs in some serial stages, a certain luminance may be maintained using the light-emitting elements LD in the remaining serial stages, and thus the possibility of a dark spot failure in the pixel PXL may be decreased. However, the disclosure is not limited thereto, and the emission part EMU may be embodied using light-emitting elements LD electrically connected only in series or only in parallel.

Each of the light-emitting elements LD may include a first end EP1 (e.g., a P-type end) electrically connected to the source of the first power VDD via at least one electrode (e.g., the first connection electrode ELT1), the pixel circuit PXC, and/or the first power line PL1, and a second end EP2 (e.g., N-type end) electrically connected to the source of the second power VSS via at least one additional electrode (e.g., the fifth connection electrode ELT5) and the second power line PL2. For example, the light-emitting elements LD may be electrically connected in a forward direction between the source of the first power VDD and the source of the second power VSS. The light-emitting elements LD electrically connected in a forward direction may form effective light sources of the emission part EMU.

In case that a driving current is supplied through the corresponding pixel circuit PXC, the light-emitting elements LD may emit light with a luminance corresponding to the driving current. For example, during each frame period, the pixel circuit PXC may supply a driving current corresponding to the grayscale value to be represented in the corresponding frame to the emission part EMU. Accordingly, the emission part EMU may maintain a luminance corresponding to the driving current while the light-emitting elements LD emit light with the luminance corresponding to the driving current.

Figure 5:
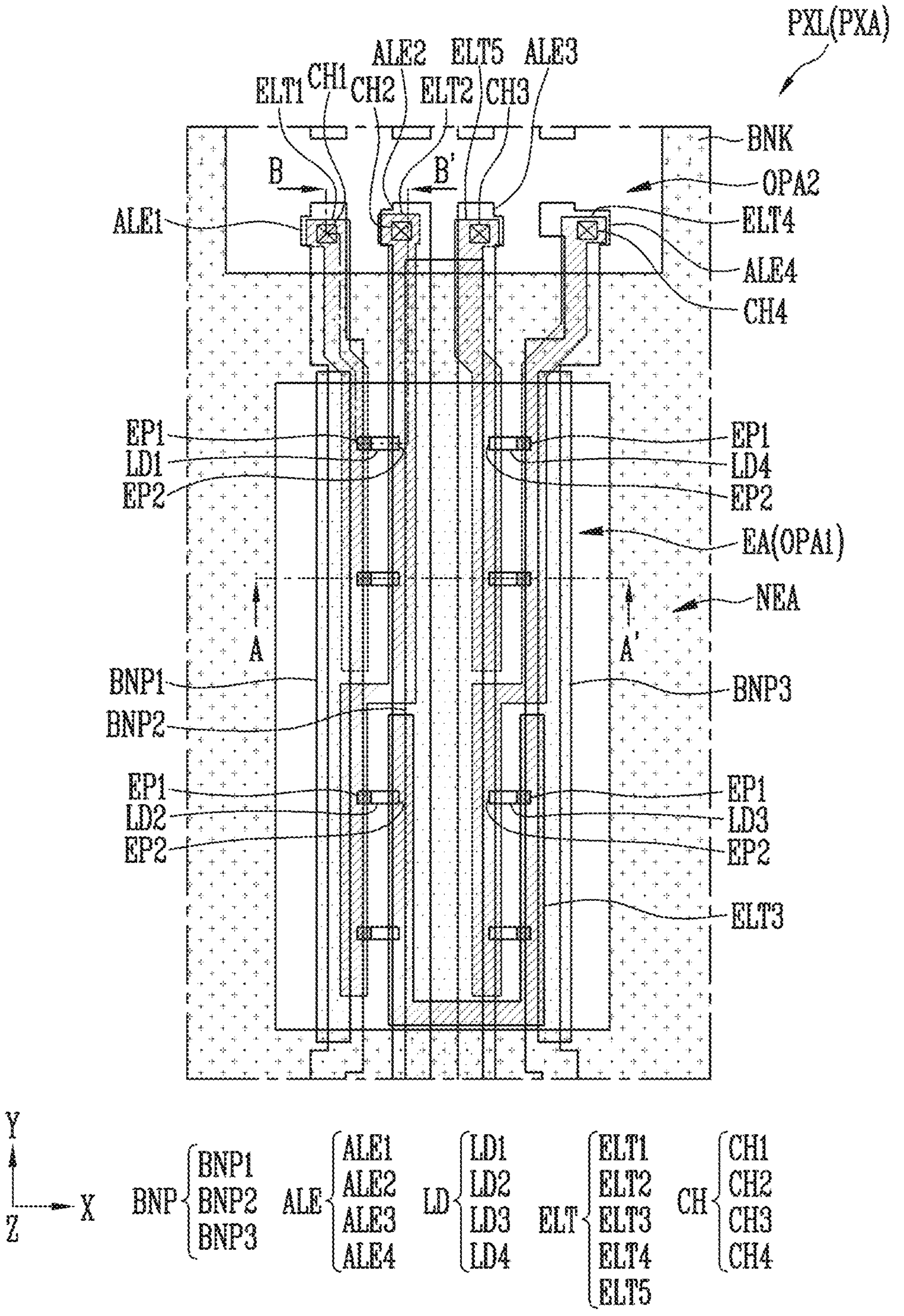
FIG. 5 is a plan view illustrating a pixel according to an embodiment.
Figure 6:
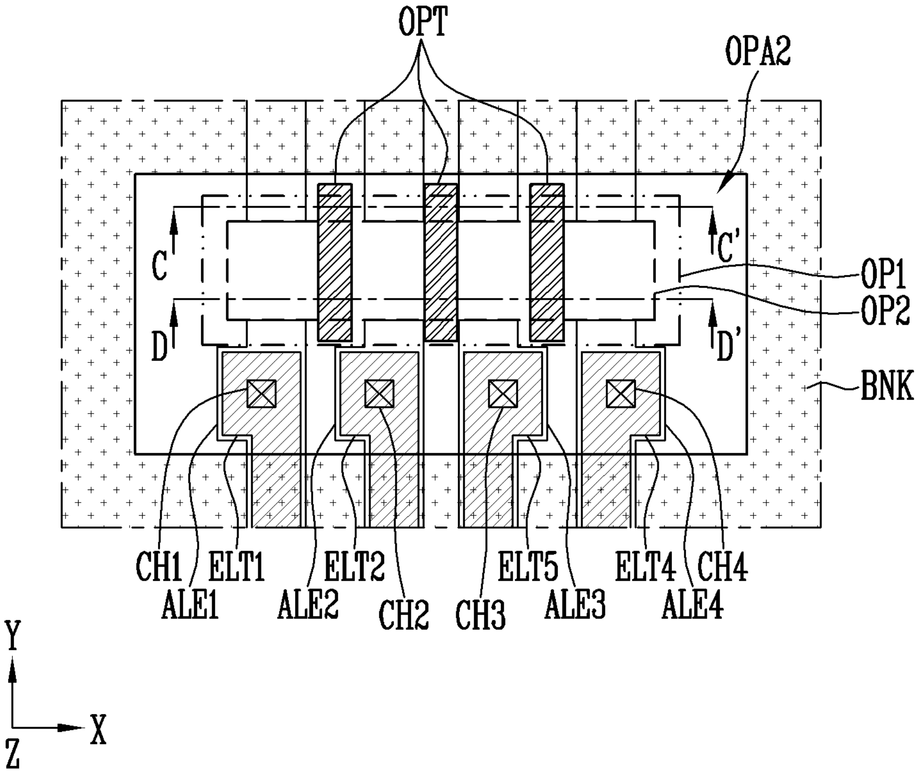
FIG. 6 is an enlarged plan view of an opening area of FIG. 5.
Figure 7:
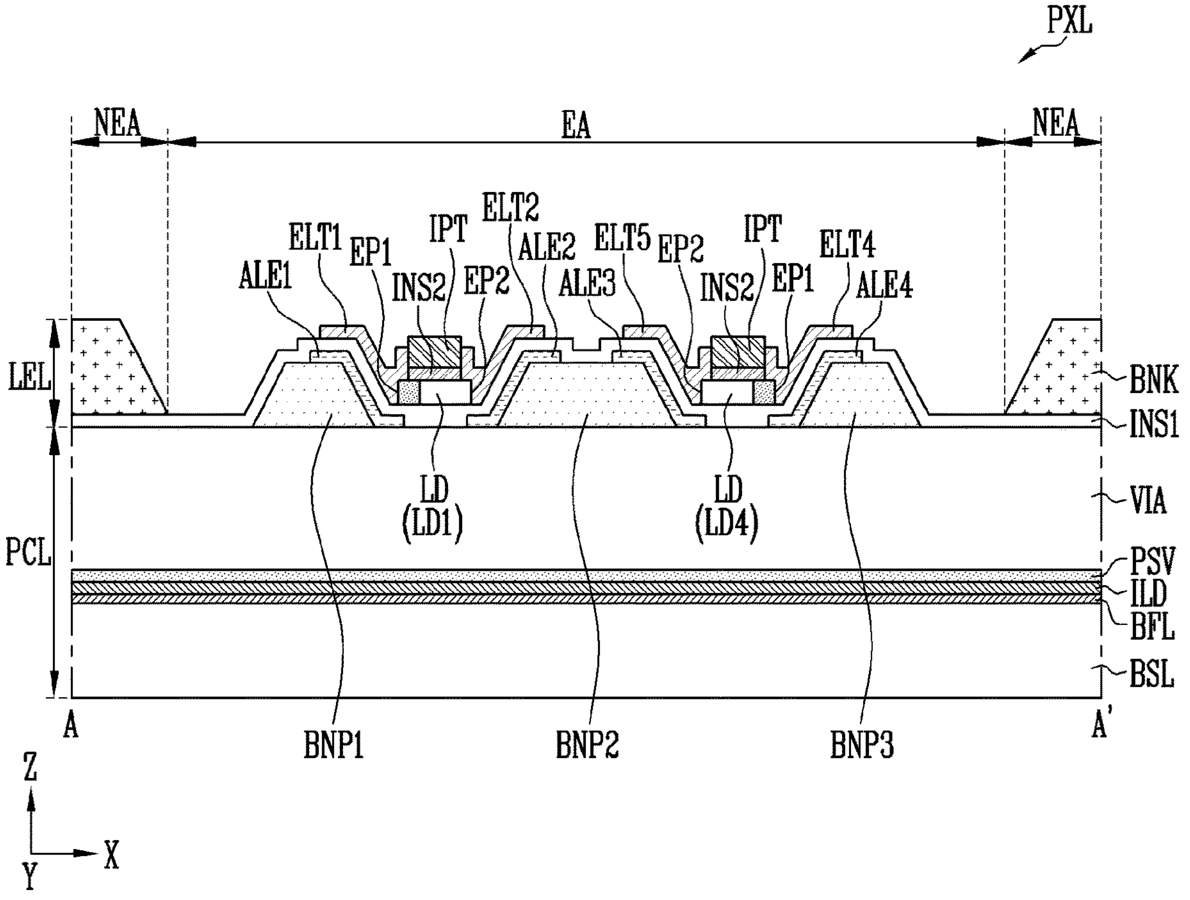
FIG. 7 is a schematic cross-sectional view taken along line A-A' of FIG. 5.
Figure 8:
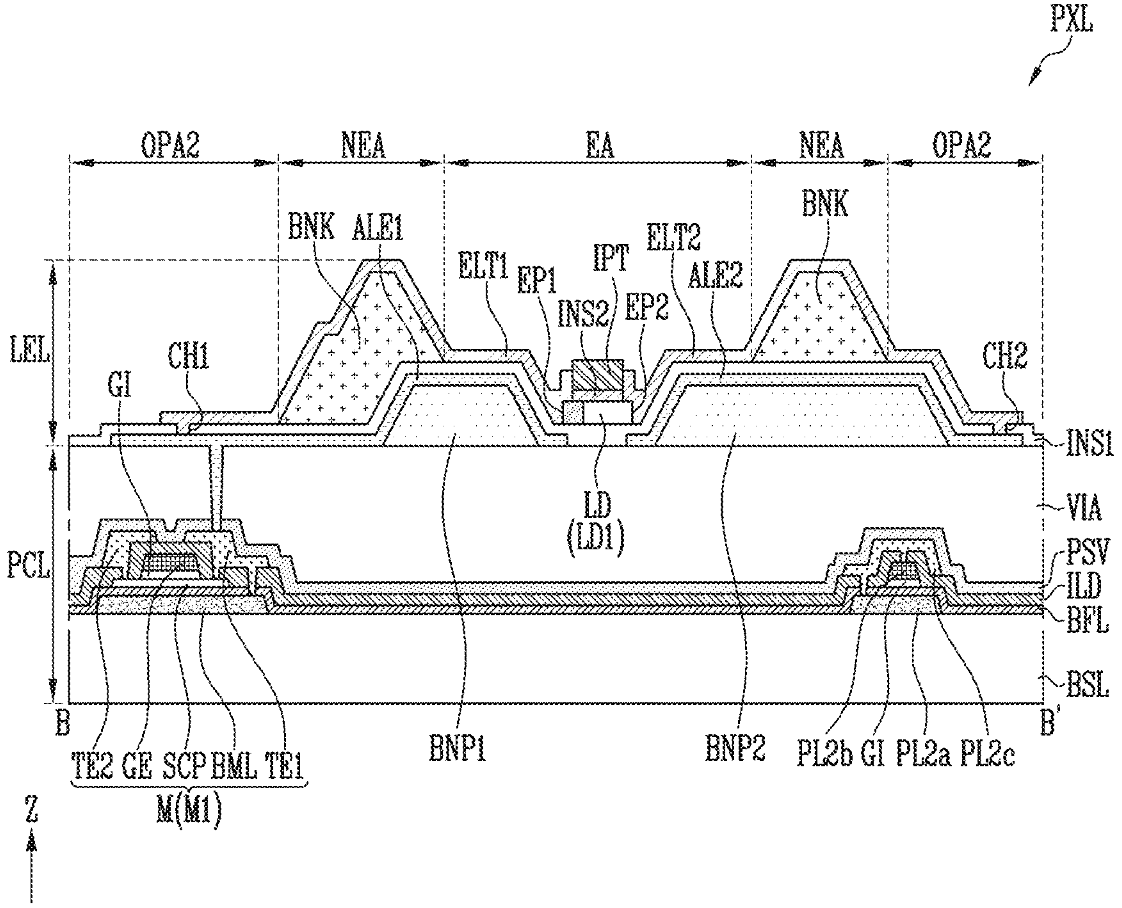
FIG. 8 is a schematic cross-sectional view taken along line B-B' of FIG. 5.
Figure 9:
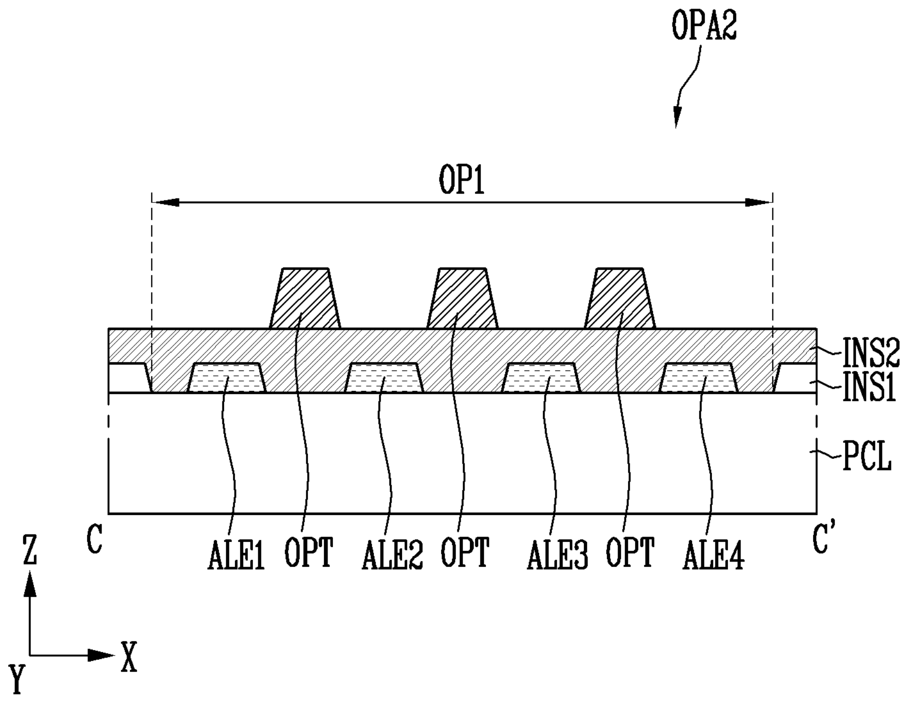
FIG. 9 is a schematic cross-sectional view taken along line C-C' of FIG. 6.
Figure 10:
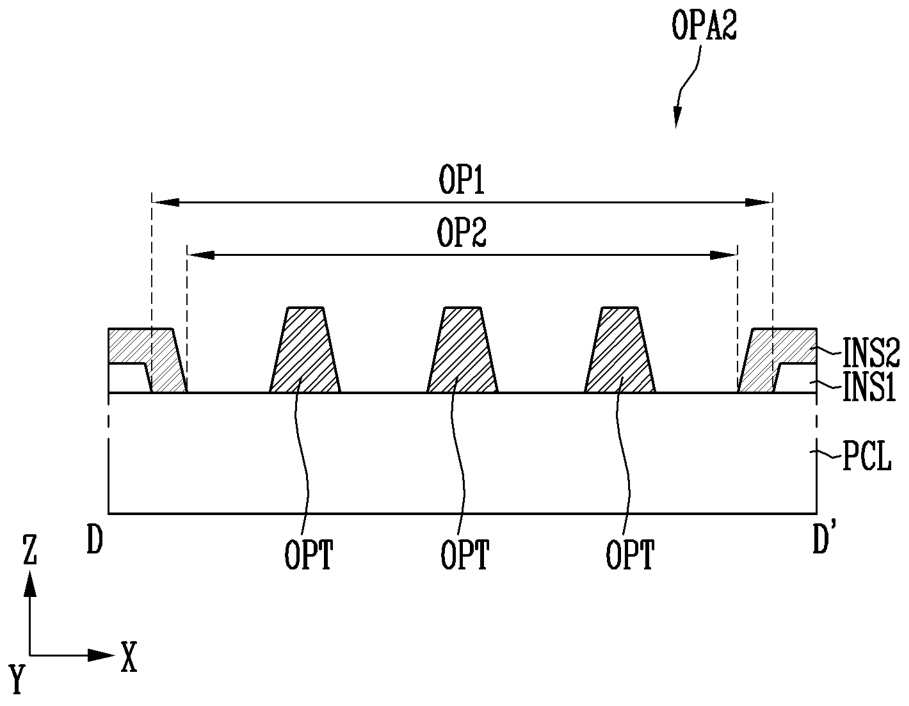
FIG. 10 is a schematic cross-sectional view taken along line D-D' of FIG. 6.

FIG. 5 is a plan view illustrating a pixel according to an embodiment. FIG. 6 is an enlarged plan view of an opening area of FIG. 5. FIG. 7 is a schematic cross-sectional view taken along line A-A' of FIG. 5. FIG. 8 is a schematic cross-sectional view taken along line B-B' of FIG. 5. FIG. 9 is a schematic cross-sectional view taken along line C-C' of FIG. 6. FIG. 10 is a schematic cross-sectional view taken along line D-D' of FIG. 6.

For example, FIG. 5 illustrates any one of the first to third pixels PXL1, PXL2, and PXL3 forming the pixel group PXL of FIG. 3, wherein the first to third pixels PXL1, PXL2, and PXL3 may have structures substantially identical or similar to each other. Further, although an embodiment in which each pixel PXL includes light-emitting elements LD arranged in four serial stages, as illustrated in FIG. 4, is illustrated in FIG. 5, the number of serial stages in each pixel PXL may be variously changed according to embodiments.

Hereinafter, in case that one or more of the first to fourth light-emitting elements LD1, LD2, LD3, and LD4 are arbitrarily designated or in case that two or more types of light-emitting elements are comprehensively designated, they may be referred to as "light-emitting element LD" or "light-emitting elements LD." Also, in case that at least one of electrodes including first to fourth electrodes ALE1, ALE2, ALE3, and ALE4 is arbitrarily designated, it may be referred to as "electrode ALE" or "electrodes ALE". Further, in case that at least one of electrodes including first to fifth connection electrodes ELT1, ELT2, ELT3, ELT4, and ELT5 is arbitrarily designated, it may be referred to as "connection electrode ELT" or "connection electrodes ELT."

Referring to FIG. 5, the pixel PXL may include an emission area EA and a non-emission area NEA. The emission area EA may be an area in which light-emitting elements LD are included for emitting light. The non-emission area NEA may be disposed to enclose the emission area EA. The non-emission area NEA may be an area in which a bank BNK enclosing the emission area EA is provided. The bank BNK may include a first opening area OPA1 overlapping the emission area EA and a second opening area OPA2 overlapping the non-emission area NEA.

Each of the pixels PXL may include electrodes ALE, light-emitting elements LD, and/or connection electrodes ELT. The electrodes ALE may be provided in at least the emission area EA. The electrodes ALE may extend in a second direction (e.g., Y axis direction), and may be spaced apart from each other in a first direction (e.g., X axis direction). The electrodes ALE may extend from the emission area EA to the non-emission area NEA. For example, the electrodes ALE may extend from the emission area EA to the second opening area OPA2. The first to fourth electrodes ALE1, ALE2, ALE3, and ALE4 may extend in the second direction (e.g., Y axis direction), and may be sequentially arranged while being spaced apart from each other in the first direction (e.g., X axis direction).

Some of the electrodes ALE may be electrically connected to a pixel circuit (e.g. PXC of FIG. 4) and/or a power line. For example, the first electrode ALE1 may be electrically connected to the pixel circuit PXC and/or the first power line PL1, and the third electrode ALE3 may be electrically connected to the second power line PL2.

In an embodiment, some of the electrodes ALE may be electrically connected to some of the connection electrodes ELT through contact holes CH. For example, the first electrode ALE1 may be electrically connected to a first connection electrode ELT1 through a first contact hole CH1, the second electrode ALE2 may be electrically connected to a second connection electrode ELT2 through a second contact hole CH2, the third electrode ALE3 may be electrically connected to a fifth connection electrode ELT5 through a third contact hole CH3, and the fourth electrode ALE4 may be electrically connected to a fourth connection electrode ELT4 through a fourth contact hole CH4. The first to fourth contact holes CH1, CH2, CH3, and CH4 may be disposed in the second opening area OPA2, but the disclosure is not limited thereto.

A pair of electrodes ALE adjacent to each other may be provided with different signals at the step of aligning the light-emitting elements LD. For example, in case that the first to fourth electrodes ALE1, ALE2, ALE3, and ALE4 are sequentially arranged in the emission area EA in the first direction (e.g., X axis direction), the first and second electrodes ALE1 and ALE2 may be paired and may be provided with different alignment signals, and the third and fourth electrodes ALE3 and ALE4 may be paired and may be provided with different alignment signals.

In an embodiment, the second and third electrodes ALE2 and ALE3 may be provided with the same signal at the step of aligning the light-emitting elements LD. Although the second and third electrodes ALE2 and ALE3 are illustrated as being separated from each other, the second and third electrodes ALE2 and ALE3 may be electrically connected to each other in an integral or non-integral connection manner at the step of aligning the light-emitting elements LD.

In accordance with an embodiment, bank patterns (e.g., BNP of FIG. 7) may be disposed under the electrodes ALE. The bank patterns BNP may be provided in at least the emission area EA. The bank patterns BNP may extend in a second direction (e.g., Y axis direction), and may be spaced apart from each other in a first direction (e.g., X axis direction).

Because the bank patterns BNP are provided under portions of respective electrodes ALE, the portions of the respective electrodes ALE may protrude upwards from the pixel PXL, for example, in the third direction (e.g., Z axis direction) in an area in which the bank patterns BNP are formed. In case that the bank patterns BNP and/or the electrodes ALE include reflective material, a reflective wall structure may be formed around the light-emitting elements LD. Accordingly, since light from the light-emitting elements LD may be emitted upwards from the pixel PXL (e.g., the front direction of the display panel PNL including a viewing angle range), the light emission efficiency of the display panel PNL may be improved.

Each of the light-emitting elements LD may be aligned between paired electrodes ALE in the emission area EA. Also, each of the light-emitting elements LD may be electrically connected between the paired connection electrodes ELT.

The first light-emitting element LD1 may be aligned between the first and second electrodes ALE1 and ALE2. The first light-emitting element LD1 may be electrically connected between the first and second connection electrodes ELT1 and ELT2. For example, the first light-emitting element LD1 may be aligned in first regions (e.g., upper regions) of the first and second electrodes ALE1 and ALE2, the first end EP1 of the first light-emitting element LD1 may be electrically connected to the first connection electrode ELT1, and the second end EP2 of the first light-emitting element LD1 may be electrically connected to the second connection electrode ELT2.

The second light-emitting element LD2 may be aligned between the first and second electrodes ALE1 and ALE2. The second light-emitting element LD2 may be electrically connected between the second and third connection electrodes ELT2 and ELT3. For example, the second light-emitting element LD2 may be aligned in second regions (e.g., lower regions) of the first and second electrodes ALE1 and ALE2, the first end EP1 of the second light-emitting element LD2 may be electrically connected to the second connection electrode ELT2, and the second end EP2 of the second light-emitting element LD2 may be electrically connected to the third connection electrode ELT3.

The third light-emitting element LD3 may be aligned between the third and fourth electrodes ALE3 and ALE4. The third light-emitting element LD3 may be electrically connected between the third and fourth connection electrodes ELT3 and ELT4. For example, the third light-emitting element LD3 may be aligned in second regions (e.g., lower regions) of the third and fourth electrodes ALE3 and ALE4, the first end EP1 of the third light-emitting element LD3 may be electrically connected to the third connection electrode ELT3, and the second end EP2 of the third light-emitting element LD3 may be electrically connected to the fourth connection electrode ELT4.

The fourth light-emitting element LD4 may be aligned between the third and fourth electrodes ALE3 and ALE4. The fourth light-emitting element LD4 may be electrically connected between the fourth and fifth connection electrodes ELT4 and ELT5. For example, the fourth light-emitting element LD4 may be aligned in first regions (e.g., upper regions) of the third and fourth electrodes ALE3 and ALE4, the first end EP1 of the fourth light-emitting element LD4 may be electrically connected to the fourth connection electrode ELT4, and the second end EP2 of the fourth light-emitting element LD4 may be electrically connected to the fifth connection electrode ELT5.

In an embodiment, the first light-emitting element LD1 may be located in an upper left region of the emission area EA, and the second light-emitting element LD2 may be located in a lower left region of the emission area EA. The third light-emitting element LD3 may be located in a lower right region of the emission area EA, and the fourth light-emitting element LD4 may be located in an upper right region of the emission area EA. However, the arrangement and/or connection structures of the light-emitting elements LD may be variously changed depending on the structure of the emission part EMU and/or the number of serial stages.

Each of the connection electrodes ELT may be provided in at least the emission area EA, and may be disposed to overlap at least one electrode ALE and/or the corresponding light-emitting element LD. For example, the connection electrodes ELT may be formed on the electrodes ALE and/or the light-emitting elements LD to overlap the electrodes ALE and/or the light-emitting elements LD, and may be electrically connected to the light-emitting elements LD.

The first connection electrode ELT1 may be disposed in the first region (e.g., an upper region) of the first electrode ALE1 and on the first ends EP1 of the first light-emitting elements LD1, and may be electrically connected to the first ends EP1 of the first light-emitting elements LD1.

The second connection electrode ELT2 may be disposed in the first region (e.g., upper region) of the second electrode ALE2 and on the second ends EP2 of the first light-emitting elements LD1, and may be electrically connected to the second ends EP2 of the first light-emitting elements LD1. Also, the second connection electrode ELT2 may be disposed in the second region (e.g., the lower region) of the first electrode ALE1 and on the first ends EP1 of the second light-emitting elements LD2, and may be electrically connected to the first ends EP1 of the second light-emitting elements LD2. For example, the second connection electrode ELT2 may electrically connect the second ends EP2 of the first light-emitting elements LD1 and the first ends EP1 of the second light-emitting elements LD2 to each other in the emission area EA. For this operation, the second connection electrode ELT2 may have a bent shape. In an embodiment, the second connection electrode ELT2 may have a bent or curved structure at a boundary between a region in which at least one first light-emitting element LD1 is arranged and a region in which at least one second light-emitting element LD2 is arranged.

The third connection electrode ELT3 may be disposed in the second region (e.g., lower region) of the second electrode ALE2 and on the second ends EP2 of the second light-emitting elements LD2, and may be electrically connected to the second ends EP2 of the second light-emitting elements LD2. Also, the third connection electrode ELT3 may be disposed in the second region (e.g., lower region) of the fourth electrode ALE4 and on the first ends EP1 of the third light-emitting elements LD3, and may be electrically connected to the first ends EP1 of the third light-emitting elements LD3. For example, the third connection electrode ELT3 may electrically connect the second ends EP2 of the second light-emitting elements LD2 and the first ends EP1 of the third light-emitting elements LD3 to each other in the emission area EA. For this operation, the third connection electrode ELT3 may have a bent shape. In an embodiment, the third connection electrode ELT3 may have a bent or curved structure at a boundary between a region in which at least one second light-emitting element LD2 is arranged and a region in which at least one third light-emitting element LD3 is arranged.

The fourth connection electrode ELT4 may be disposed in the second region (e.g., lower region) of the third electrode ALE3 and on the second ends EP2 of the third light-emitting elements LD3, and may be electrically connected to the second ends EP2 of the third light-emitting elements LD3. Also, the fourth connection electrode ELT4 may be disposed in the first region (e.g., upper region) of the fourth electrode ALE4 and on the first ends EP1 of the fourth light-emitting elements LD4, and may be electrically connected to the first ends EP1 of the fourth light-emitting elements LD4. For example, the fourth connection electrode ELT4 may electrically connect the second ends EP2 of the third light-emitting elements LD3 and the first ends EP1 of the fourth light-emitting elements LD4 to each other in the emission area EA. For this operation, the fourth connection electrode ELT4 may have a bent shape. In an embodiment, the fourth connection electrode ELT4 may have a bent or curved structure at a boundary between a region in which at least one third light-emitting element LD3 is arranged and a region in which at least one fourth light-emitting element LD4 is arranged.

The fifth connection electrode ELT5 may be disposed in the first region (e.g., upper region) of the third electrode ALE3 and on the second ends EP2 of the fourth light-emitting elements LD4, and may be electrically connected to the second ends EP2 of the fourth light-emitting elements LD4.

In the above-described embodiment, light-emitting elements LD aligned between the electrodes ALE may be electrically connected in a form using the connection electrodes ELT. For example, the first light-emitting elements LD1, the second light-emitting elements LD2, the third light-emitting elements LD3, and the fourth light-emitting elements LD4 may be sequentially electrically connected in series using the connection electrodes ELT.

In an embodiment, organic patterns OPT may be disposed between the electrodes ALE. Reference is to be made to FIG. 6 for a detailed description of the organic patterns OPT. Referring to FIG. 6, the organic patterns OPT may be disposed between electrodes ALE in a second opening area OPA2. The second opening area OPA2 may include a first opening OP1 and a second opening OP2. The second opening OP2 may overlap the first opening OP1. The second opening OP2 may have an area smaller than that of the first opening OP1. The second opening OP2 may be an area that does not overlap the electrodes ALE. For example, the electrodes ALE may be disconnected in the second opening OP2.

Each of the organic patterns OPT may extend in a second direction (e.g., Y axis direction). Portions of the organic patterns OPT may be spaced apart from each other in a first direction (e.g., X axis direction) in the second opening OP2. The remaining portions of the organic patterns OPT may be disposed between the electrodes ALE in the first opening OP1. The remaining portions of the organic patterns OPT may be spaced apart from each other in the first direction (e.g., X axis direction), with at least one electrode ALE interposed therebetween, in the first opening OP1. Each of the organic patterns OPT may be disposed between the electrodes ALE to locally compensate for height differences, thus enabling the connection electrodes ELT stacked over the electrodes ALE to be stably etched at the step of removing the connection electrodes ELT in the second opening area OPA2. Therefore, in the second opening area OPA2, especially in the second opening OP2 in which the electrodes ALE are disconnected, short-circuit failures in the electrodes ALE attributable to residue in the connection electrodes ELT may be prevented.

Hereinafter, the sectional structure of each pixel PXL will be described in detail with light-emitting elements LD with reference to FIGS. 7 and 8. FIGS. 7 and 8 illustrate a pixel circuit layer PCL and a light-emitting element layer LEL of the pixel PXL. In FIG. 8, a first transistor M1, among various circuit elements forming the pixel circuit (e.g., PXC of FIG. 4), is illustrated, and is comprehensively designated as a “transistor M” unless there is a need to classify and specify transistors into first to third transistors M1, M2, and M3. The structures and/or layer locations of the transistors M are not limited to the embodiment illustrated in FIG. 8, and may be changed in various forms according to an embodiment.

Referring to FIGS. 7 and 8, each of the pixel circuit layer PCL and the light-emitting element layer LEL of the pixels PXL according to an embodiment may include circuit elements including transistors M disposed on a base layer BSL and various lines electrically connected to the circuit elements. The light-emitting element layer LEL including electrodes ALE, light-emitting elements LD, and/or connection electrodes ELT may be disposed on the pixel circuit layer PCL.

The base layer BSL may be a rigid or flexible substrate or film. In an embodiment, the base layer BSL may be a rigid substrate formed of glass or tempered glass, a flexible substrate (or a thin film) formed of a plastic or metal material, or at least one insulating layer. The material and/or the physical properties of the base layer BSL are not particularly limited. In an embodiment, the base layer BSL may be substantially transparent. Here, the expression “substantially transparent” means that the base layer BSL transmits light with a certain transmissivity or higher. In other embodiments, the base layer BSL may be translucent or opaque. Also, the base layer BSL may include a reflective material according to an embodiment.

On the base layer BSL, a lower conductive layer BML and a first power conductive layer PL2*a* may be disposed. The lower conductive layer BML and the first power conductive layer PL2*a* may be disposed on the same layer. For example, although the lower conductive layer BML and the first power conductive layer PL2*a* may be simultaneously formed in the same process, the disclosure is not limited thereto. The first power conductive layer PL2*a* may form the second power line PL2, described above with reference to FIG. 4 or the like.

Each of the lower conductive layer BML and the first power conductive layer PL2*a* may be implemented as a single-layer structure or a multi-layer structure including molybdenum (Mo), copper (Cu), aluminum (Al), chrome (Cr), gold (Au), titanium (Ti), nickel (N1), neodymium (Nd), indium (In), tin (Sn), an oxide thereof, or an alloy thereof.

A buffer layer BFL may be disposed on the lower conductive layer BML and the first power conductive layer PL2*a*. The buffer layer BFL may prevent impurities from diffusing to circuit elements. The buffer layer BFL may have a single-layer structure, but may also have a multi-layer structure having two or more layers. In the case in which the buffer layer BFL is formed to have a multi-layer structure, respective layers may be formed of the same material or different materials.

A semiconductor pattern SCP may be disposed on the buffer layer BFL. In an embodiment, the semiconductor pattern SCP may include a first region contacting a first transistor electrode TE1, a second region contacting a second transistor electrode TE2, and a channel region disposed between the first and second regions. In accordance with an embodiment, one of the first and second regions may be a source region and the other thereof may be a drain region.

In accordance with an embodiment, the semiconductor pattern SCP may be formed of polysilicon, amorphous silicon, an oxide semiconductor, or the like. Further, the channel region of the semiconductor pattern SCP may be an intrinsic semiconductor as a semiconductor pattern undoped with impurities, and each of the first and second regions of the semiconductor pattern SCP may be a semiconductor doped with impurities.

A gate insulating layer GI may be disposed on the buffer layer BFL and the semiconductor pattern SCP. In an embodiment, the gate insulating layer GI may be disposed between the semiconductor pattern SCP and a gate electrode GE. Further, the gate insulating layer GI may be disposed between the buffer layer BFL and a second power conductive layer PL2*b*. The gate insulating layer GI may have a single-layer or multi-layer structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The gate electrode GE of the transistor M and the second power conductive layer PL2*b* may be disposed on the gate insulating layer GI. The gate electrode GE and the second power conductive layer PL2*b* may be disposed on the same layer. For example, although the gate electrode GE and the second power conductive layer PL2*b* may be simultaneously formed in the same process, the disclosure is not limited thereto. The gate electrode GE may overlap the semiconductor pattern SCP in a third direction (e.g., Z axis direction) while being disposed on the gate insulating layer GI. The second power conductive layer PL2*b* may overlap the first power conductive layer PL2*a* in the third direction (e.g., Z axis direction) while being disposed on the gate insulating layer GI. The second power conductive layer PL2*b*, together with the first power conductive layer PL2*a*, may form the second power line PL2, described above with reference to FIG. 4 or the like.

Each of the gate electrode GE and the second power conductive layer PL2*b* may be implemented as a single-layer structure or a multi-layer structure made of molybdenum (Mo), copper (Cu), aluminum (Al), chrome (Cr), gold (Au), titanium (Ti), nickel (N1), neodymium (Nd), indium (In), tin (Sn), an oxide thereof, or an alloy thereof.

An interlayer insulating layer ILD may be disposed on the gate electrode GE and the second power conductive layer PL2*b*. In an embodiment, the interlayer insulating layer ILD may be disposed between the gate electrode GE and the first and second transistor electrodes TE1 and TE2. Also, the interlayer insulating layer ILD may be disposed between the second power conductive layer PL2*b* and a third power conductive layer PL2*c*.

The interlayer insulating layer ILD may have a single-layer or multi-layer structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second transistor electrodes TE1 and TE2 of the transistor M and the third power conductive layer PL2*c* may be disposed on the interlayer insulating layer ILD. The first and second transistor electrodes TE1 and TE2 and the third power conductive layer PL2*c* may be disposed on the same layer. For example, although the first and second transistor electrodes TE1 and TE2 and the third power conductive layer PL2*c* may be simultaneously formed in the same process, the disclosure is not limited thereto.

The first and second transistor electrodes TE1 and TE2 may be disposed to overlap the semiconductor pattern SCP in a third direction (e.g., Z axis direction). The first and second transistor electrodes ET1 and ET2 may be electrically connected to the semiconductor pattern SCP. For example, the first transistor electrode TE1 may be electrically connected to a first region of the semiconductor pattern SCP through a contact hole passing through the interlayer insulating layer ILD. Also, the first transistor electrode TE1 may be electrically connected to the lower conductive layer BML through a contact hole passing through the interlayer insulating layer ILD and the buffer layer BFL. The second transistor electrode TE1 may be electrically connected to a second region of the semiconductor pattern SCP through a contact hole passing through the interlayer insulating layer ILD. In accordance with an embodiment, any one of the first and second transistor electrodes TE1 and TE2 may be a source electrode, and the other may be a drain electrode.

The third power conductive layer PL2*c* may be disposed to overlap the first power conductive layer PL2*a* and/or the second power conductive layer PL2*b* in a third direction (e.g., Z axis direction). The third power conductive layer PL2*c* may be electrically connected to the first power conductive layer PL2*a* and/or the second power conductive layer PL2*b*. For example, the third power conductive layer PL2*c* may be electrically connected to the first power conductive layer PL2*a* through a contact hole passing through the interlayer insulating layer ILD and the buffer layer BFL. Further, the third power conductive layer PL2*c* may be electrically connected to the second power conductive layer PL2*b* through a contact hole passing through the interlayer insulating layer ILD. The third power conductive layer PL2*c*, together with the first power conductive layer PL2*a* and/or the second power conductive layer PL2*b*, may form the second power line PL2, described above with reference to FIG. 4 or the like.

Each of the first and second transistor electrodes TE1 and TE2 and the third power conductive layer PL2*c* may be implemented as a single-layer structure or a multi-layer structure made of molybdenum (Mo), copper (Cu), aluminum (Al), chrome (Cr), gold (Au), titanium (Ti), nickel (N1), neodymium (Nd), indium (In), tin (Sn), an oxide thereof, or an alloy thereof.

A protective layer PSV may be disposed on the first and second transistor electrodes TE1 and TE2 and the third power conductive layer PL2*c*. The protective layer PSV may have a single-layer or multi-layer structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A via layer VIA may be disposed on the protective layer PSV. The via layer VIA may be made of an organic material so as to planarize the components having height differences below the via layer. For example, the via layer VIA may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the via layer VIA may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Bank patterns BNP of the light-emitting element layer LEL may be disposed on the via layer VIA of the pixel circuit layer PCL. The bank patterns BNP may have various shapes depending on the embodiment. In an embodiment, the bank patterns BNP may each have a shape protruding from the base layer BSL in a third direction (e.g., Z axis direction). Further, each of the bank patterns BNP may be formed to have a slope inclined at a certain angle with respect to the base layer BSL. However, the disclosure is not limited thereto, and each of the bank patterns BNP may include a sidewall having a curved surface or a step shape. For example, each of the bank patterns BNP may have a section such as a semicircular or semi-elliptical shape.

The electrodes and insulating layers disposed on the bank patterns BNP may have shapes corresponding to the bank patterns BNP. In an embodiment, each of the electrodes ALE disposed on the bank patterns BNP may have a slope or a curved surface having a shape corresponding to that of the bank patterns BNP. Accordingly, the bank patterns BNP, together with the electrodes ALE provided on the bank patterns BNP, may function as a reflective member, which induces light emitted from the light-emitting elements LD to move in the front direction of the pixel PXL, for example, in the third direction (e.g., Z axis direction), and improves the light emission efficiency of the display panel PNL.

Each of the bank patterns BNP may include at least one organic material and/or inorganic material. For example, the bank patterns BNP may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the bank patterns BNP may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The electrodes ALE may be disposed on the via layer VIA and the bank patterns BNP. The electrodes ALE may be disposed to be spaced apart from each other in the pixel PXL. The electrodes ALE may be disposed on the same layer. For example, the electrodes ALE may be simultaneously formed in the same process, but the disclosure is not limited thereto.

The electrodes ALE may be provided with an alignment signal at the step of aligning light-emitting elements LD. Accordingly, an electric field may be formed between the electrodes ALE, and thus the light-emitting elements LD provided in each pixel PXL may be aligned between the electrodes ALE.

The electrodes ALE may include at least one conductive material. In an embodiment, the electrodes ALE may include, but are not limited to, at least one of metal materials including silver (Ag), magnesium (Mg), aluminum (Al), platinum (Pt), palladium (Pd), gold (Au), nickel (N1), neodymium (Nd), iridium (Ir), chrome (Cr), titanium (Ti), molybdenum (Mo), and copper (Cu), alloy thereof, conductive oxide, such as indium tin oxide (ITO), indium zinc oxide (IZO), indium tin zinc oxide (ITZO), aluminum zinc oxide (AZO), gallium doped zinc oxide (GZO), zinc tin oxide (ZTO), a gallium tin oxide (GTO), and conductive polymer such as PEDOT.

A first insulating layer INS1 may be disposed on the electrodes ALE. The first insulating layer INS1 may have a single-layer or multi-layer structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A bank BNK may be disposed on the first insulating layer INS1. The bank BNK may form a dam-shaped structure for partitioning the emission area in which light-emitting elements LD are to be provided at the step of providing the light-emitting elements LD to each of the pixels PXL. For example, a desired type and/or a desired amount of light-emitting element ink may be supplied to the area partitioned by the bank BNK.

The bank BNK may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the bank BNK may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

In accordance with an embodiment, the bank BNK may include at least one light blocking and/or reflective material. Accordingly, light leakage between adjacent pixels PXL may be prevented. For example, the bank BNK may include at least one black matrix material and/or color filter material. In an embodiment, the bank BNK may be formed as a black opaque pattern that is capable of blocking the penetration of light. In an embodiment, a reflective layer (not illustrated) or the like may be formed on the surface (e.g., sidewall) of the bank BNK in order to improve the light efficiency of each pixel PXL.

The light-emitting elements LD may be disposed on the first insulating layer INS1. The light-emitting elements LD may be disposed between the electrodes ALE while being provided on the first insulating layer INS1. The light-emitting elements LD may be prepared in a form dispersed in the light-emitting element ink and may be provided to each of the pixels PXL using an ink jet printing method or the like. In an embodiment, the light-emitting elements LD may be dispersed in a volatile solvent and may be provided to each of the pixels PXL. In case that an alignment signal is supplied to the electrodes ALE, an electric field may be formed between the electrodes ALE, and thus the light-emitting elements LD may be aligned between the electrodes ALE. After the light-emitting elements LD have been aligned, the solvent may be volatilized or removed using other additional methods, and thus the light-emitting elements LD may be stably arranged between the electrodes ALE.

A second insulating layer INS2 may be disposed on the light-emitting elements LD. For example, the second insulating layer INS2 may be partially provided on the light-emitting elements LD, and may expose the first and second ends EP1 and EP2 of the light-emitting elements LD. In case that the second insulating layer INS2 is formed on the light-emitting elements LD after alignment of the light-emitting elements LD has been completed, the light-emitting elements LD may be prevented from moving from the aligned locations thereof.

The second insulating layer INS2 may have a single-layer or multi-layer structure, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

An insulating pattern IPT may be disposed on the second insulating layer INS2. The insulating pattern IPT may overlap the light-emitting elements LD while being disposed on the second insulating layer INS2. For example, the insulating pattern IPT may be disposed over the light-emitting elements LD between the connection electrodes ELT. The insulating pattern IPT may expose the first and second ends EP1 and EP2 of the light-emitting elements LD. The thickness of the insulating pattern IPT in the third direction (e.g., Z axis direction) may be greater than that of the second insulating layer INS2 in the third direction (e.g., Z axis direction). In this way, in case that the insulating pattern IPT is formed over the light-emitting element LD to be higher, the connection electrodes ELT1 and ELT2 formed on the first and second ends EP1 and EP2 of the light-emitting element LD may be stably separated. Since short-circuits between the connection electrodes ELT attributable to the insulating pattern IPT may be prevented, the connection electrodes ELT may be simultaneously formed. For example, a manufacturing process may be simplified by reducing the number of masks.

The insulating pattern IPT may include various types of organic materials such as acrylic resin, epoxy resin, phenolic resin, polyamide resin, polyimide resin, polyester resin, polyphenylenesulfide resin, or benzocyclobutene (BCB).

The connection electrodes ELT may be disposed on the first and second ends EP1 and EP2 of the light-emitting elements LD exposed by the second insulating layer INS2. The connection electrodes ELT may be disposed on the same layer. For example, the connection electrodes ELT may be formed of the same conductive layer. The connection electrodes ELT may be simultaneously formed in the same process. As described above, because the connection electrodes ELT may be separated and simultaneously formed using the height of the insulating pattern IPT, the process of manufacturing the display device may be simplified by reducing the number of masks. For example, after the connection electrodes ELT are formed as a single conductive layer on the light-emitting elements LD, the conductive layer formed on the insulating pattern IPT may be partially removed, and may then be separated into respective connection electrodes ELT. Therefore, the connection electrodes ELT may partially remain on the side surface of the insulating pattern IPT.

The first connection electrode ELT1 may be directly disposed on the first ends EP1 of the first light-emitting elements LD1, and may contact the first ends EP1 of the first light-emitting elements LD1.

Also, the second connection electrode ELT2 may be directly disposed on the second ends EP2 of the first light-emitting elements LD1, and may contact the second ends EP2 of the first light-emitting elements LD1. Further, the second connection electrode ELT2 may be directly disposed on the first ends EP1 of the second light-emitting elements LD2, and may contact the first ends EP1 of the second light-emitting elements LD2. For example, the second connection electrode ELT2 may electrically connect the second ends EP2 of the first light-emitting elements LD1 to the first ends EP1 of the second light-emitting elements LD2.

Similarly, the third connection electrode ELT3 may be directly disposed on the second ends EP2 of the second light-emitting elements LD2, and may contact the second ends EP2 of the second light-emitting elements LD2. Further, the third connection electrode ELT3 may be directly disposed on the first ends EP1 of the third light-emitting elements LD3, and may contact the first ends EP1 of the third light-emitting elements LD3. For example, the third connection electrode ELT3 may electrically connect the second ends EP2 of the second light-emitting elements LD2 to the first ends EP1 of the third light-emitting elements LD3.

Similarly, the fourth connection electrode ELT4 may be directly disposed on the second ends EP2 of the third light-emitting elements LD3, and may contact the second ends EP2 of the third light-emitting elements LD3. Further, the fourth connection electrode ELT4 may be directly disposed on the first ends EP1 of the fourth light-emitting elements LD4, and may contact the first ends EP1 of the fourth light-emitting elements LD4. For example, the fourth connection electrode ELT4 may electrically connect the second ends EP2 of the third light-emitting elements LD3 to the first ends EP1 of the fourth light-emitting elements LD4.

Similarly, the fifth connection electrode ELT5 may be directly disposed on the second ends EP2 of the fourth light-emitting elements LD4, and may contact the second ends EP2 of the fourth light-emitting elements LD4.

The connection electrodes ELT may be formed of various types of transparent conductive materials. In an embodiment, the connection electrodes ELT may include at least one of various transparent conductive materials, such as indium tin oxide (ITO), indium zinc oxide (IZO), indium tin zinc oxide (ITZO), aluminum zinc oxide (AZO), gallium doped zinc oxide (GZO), zinc tin oxide (ZTO), and gallium tin oxide (GTO), and may be implemented to be substantially transparent or translucent so as to satisfy a specific transmissivity. Accordingly, light emitted from the first and second ends EP1 and EP2 of the light-emitting elements LD may be emitted to the outside of the display panel PNL after passing through the connection electrodes ELT.

Hereinafter, the sectional structure of a second opening area OPA2 will be described in detail with an organic pattern OPT with reference to FIGS. 9 and 10. In FIGS. 9 and 10, for convenience of description, a pixel circuit layer PCL is schematically illustrated and a detailed description thereof is omitted.

A first insulating layer INS1 may include a first opening OP1 located in the second opening area OPA2. The first opening OP1 in the first insulating layer INS1 may at least partially expose electrodes ALE.

The second insulating layer INS2 may be disposed on the first insulating layer INS1 in the second opening area OPA2. The second insulating layer INS2 may include the second opening OP2 located in the second opening area OPA2. The second insulating layer INS2 may at least partially cover the electrodes ALE exposed through the first opening OP1 in the first insulating layer INS1. The second opening OP2 in the second insulating layer INS2 may not overlap the electrodes ALE. For example, the electrodes ALE may be disconnected in the second opening OP2 in the second insulating layer INS2.

Portions of the organic patterns OPT may be disposed on the pixel circuit layer PCL exposed through the second opening OP2 in the second insulating layer INS2. The remaining portions of the organic patterns OPT may be disposed on the second insulating layer INS2. The remaining portions of the organic patterns OPT may be disposed between the electrodes ALE while being disposed on the second insulating layer INS2. Each of the organic patterns OPT may be disposed between the electrodes ALE to locally compensate for height differences, thus enabling the connection electrodes ELT stacked over the electrodes ALE to be stably etched at the step of removing the connection electrodes ELT in the second opening area OPA2. Therefore, as described above, in the second opening area OPA2, especially in the second opening OP2 in which the electrodes ALE are disconnected, short-circuit failures in the electrodes ALE attributable to residue in the connection electrodes ELT may be prevented.

The thickness of each organic pattern OPT in the third direction (e.g., Z axis direction) may be greater than that of the second insulating layer INS2 in the third direction (e.g., Z axis direction). The organic pattern OPT may include various types of organic materials such as acrylic resin, epoxy resin, phenolic resin, polyamide resin, polyimide resin, polyester resin, polyphenylenesulfide resin, or benzocyclobutene (BCB). For example, the organic pattern OPT and the above-described insulating pattern IPT may include the same material. For example, the organic pattern OPT and the insulating pattern IPT may be simultaneously formed in the same process, but the disclosure is not limited thereto.

According to the above-described embodiment, because the connection electrodes ELT may be separated and simultaneously formed using the height of the insulating pattern IPT, the number of masks may be reduced. Furthermore, the organic patterns OPT may be formed in the second opening OP2 in which the electrodes ALE are disconnected, so the connection electrodes ELT may be stably removed, and thus short-circuit failures in the electrodes ALE attributable to residue in the connection electrodes ELT may be prevented. Further, the organic pattern OPT and the insulating pattern IPT may be simultaneously formed in the same process, and thus the process of manufacturing a display device may be simplified.

Figure 11:
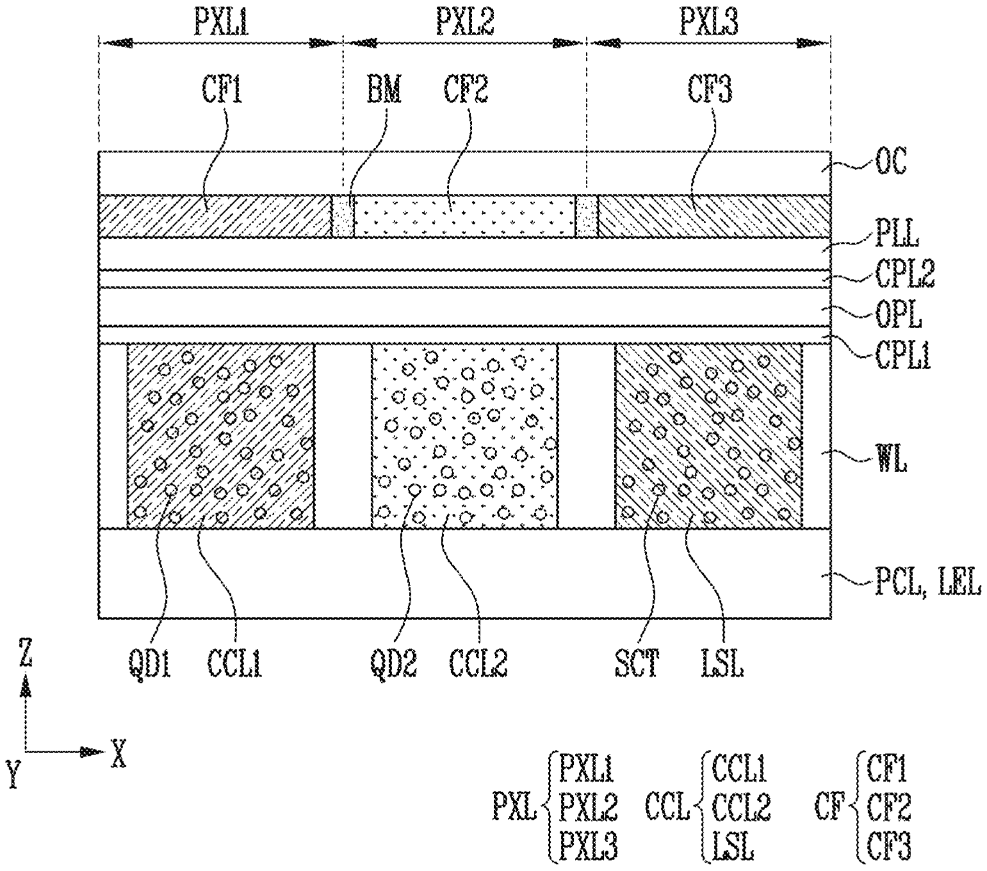
FIG. 11 is a schematic cross-sectional view illustrating first to third pixels according to an embodiment.
Figure 12:
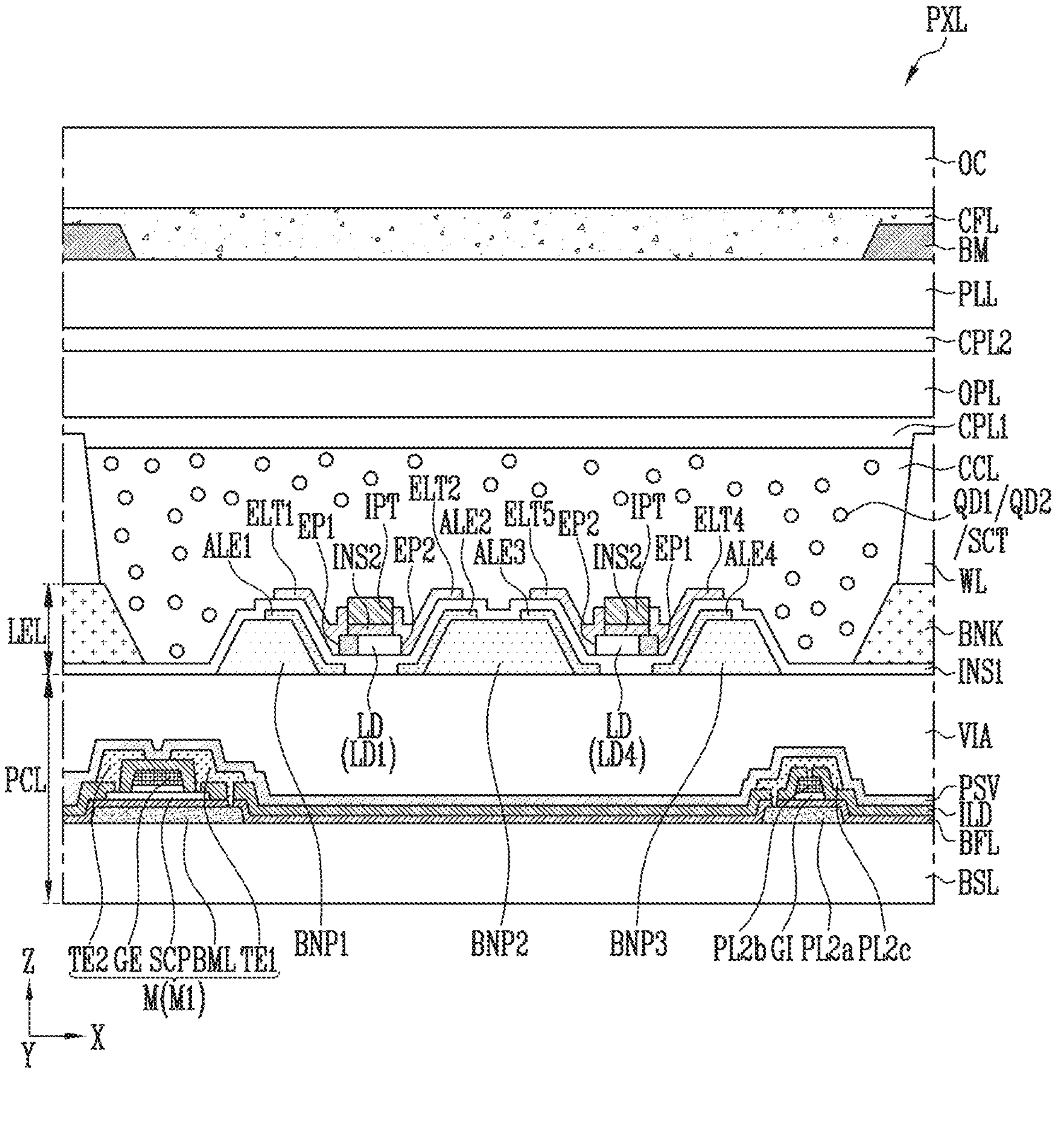
FIGS. 12 to 14 are schematic cross-sectional views of a pixel according to embodiments.
Figure 13:
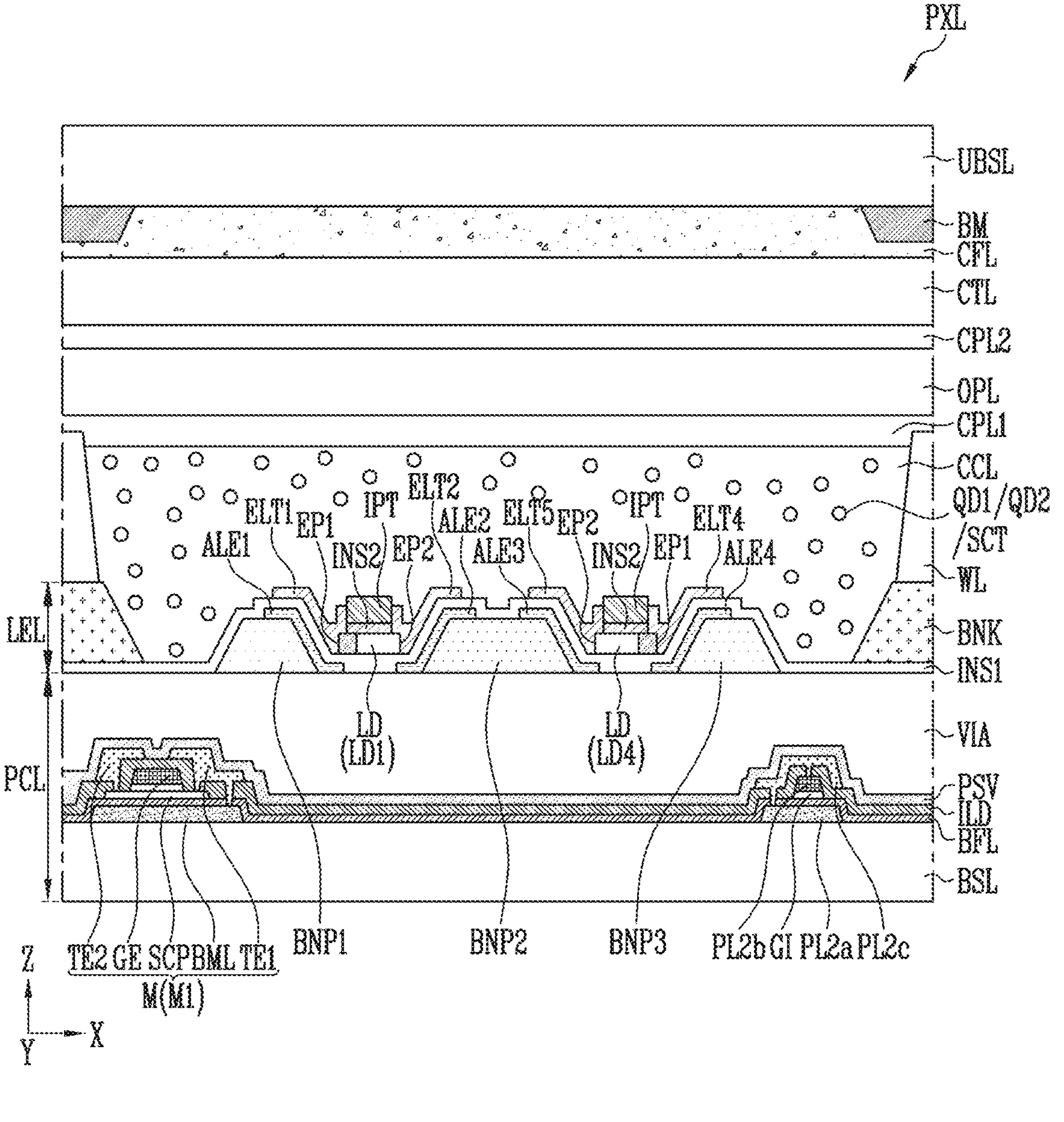
Figure 14:
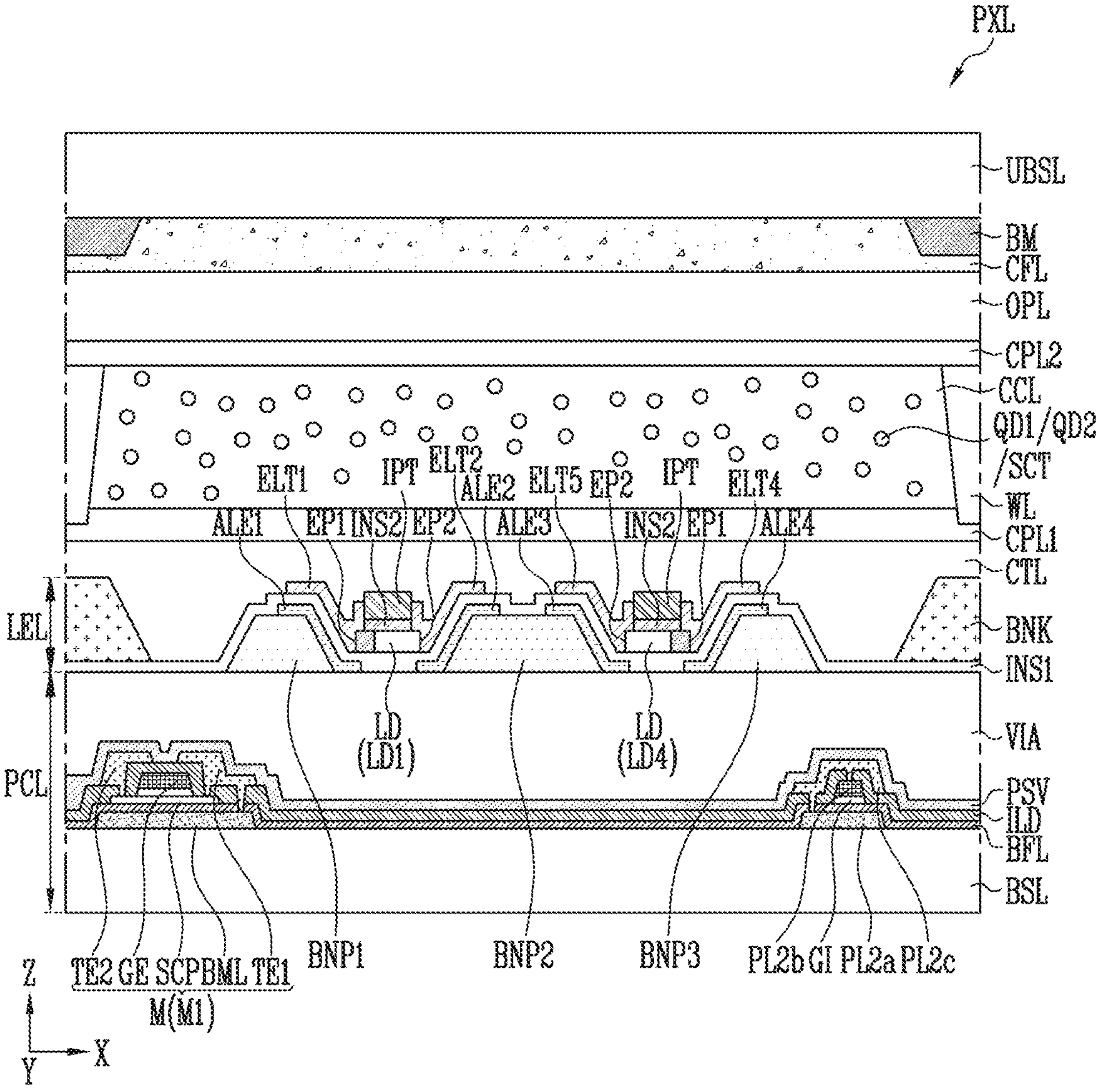
Figure 15:
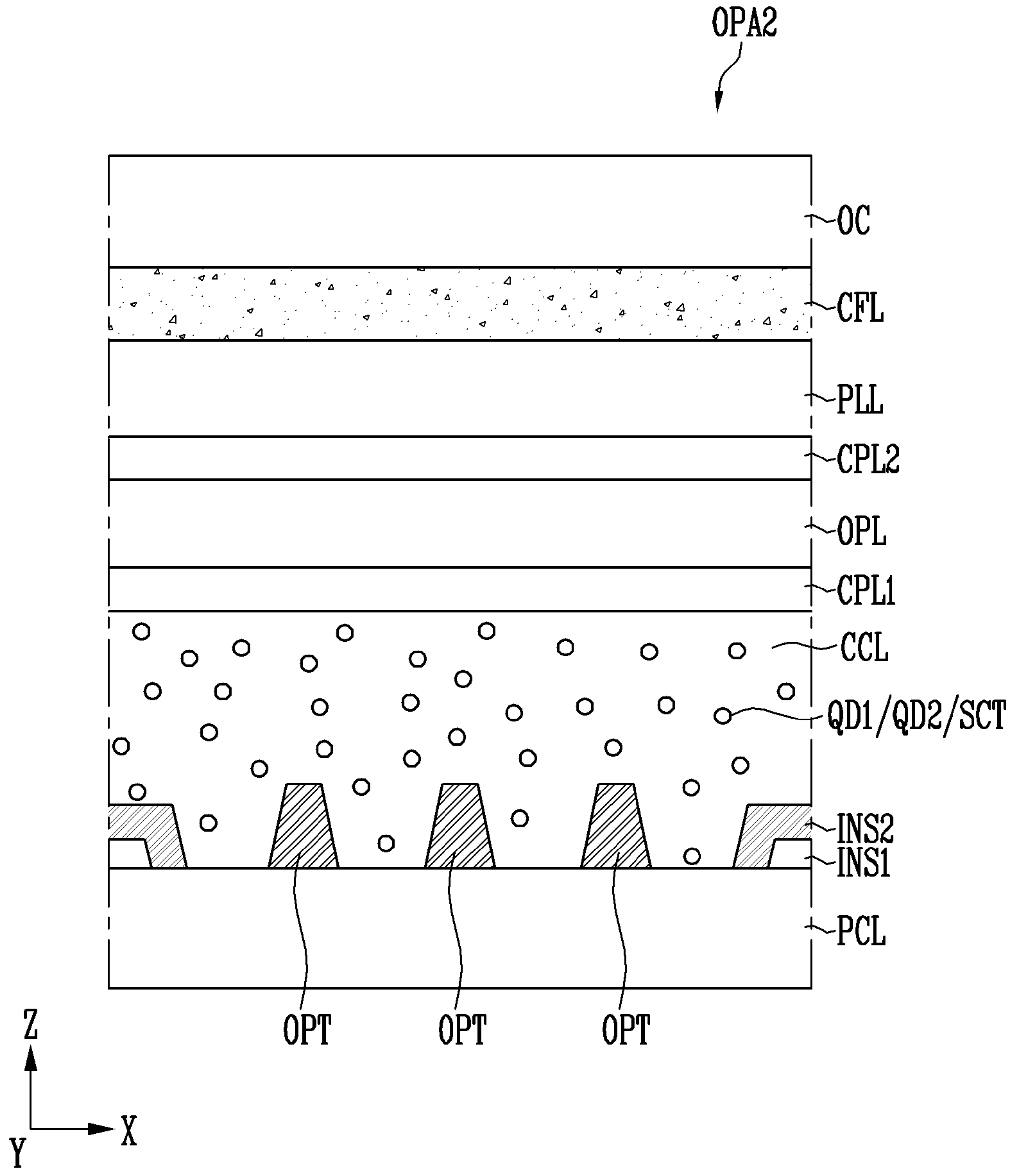
FIGS. 15 to 17 are schematic cross-sectional views of an opening area according to embodiments.
Figure 16:
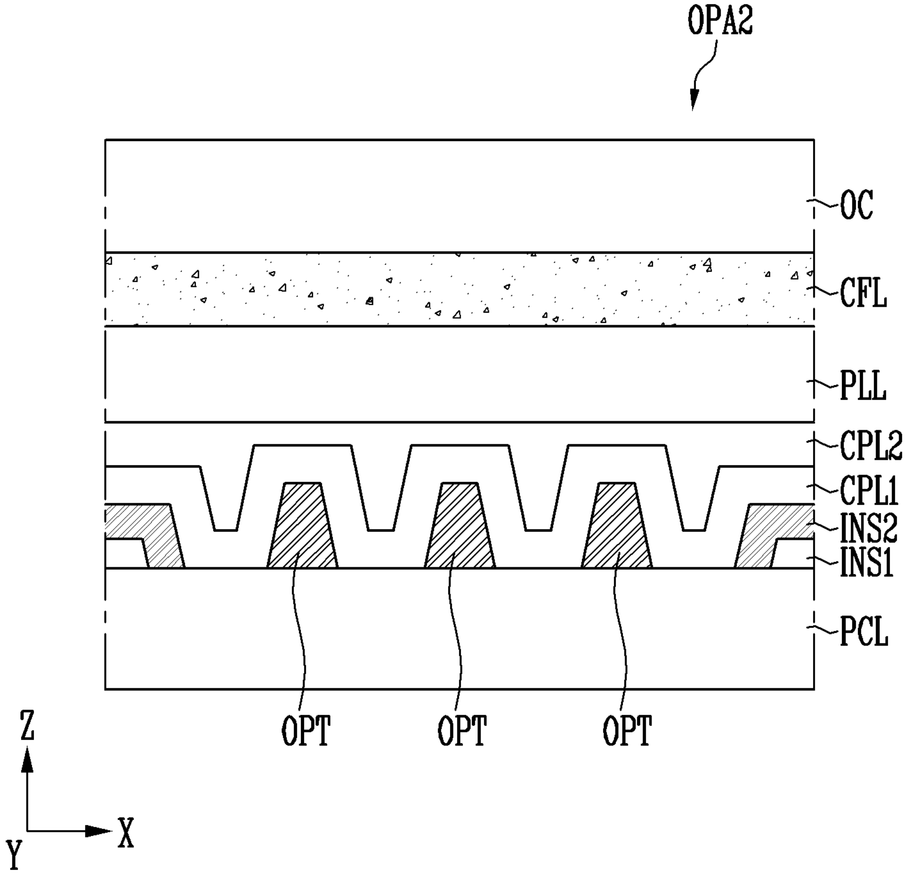
Figure 17:
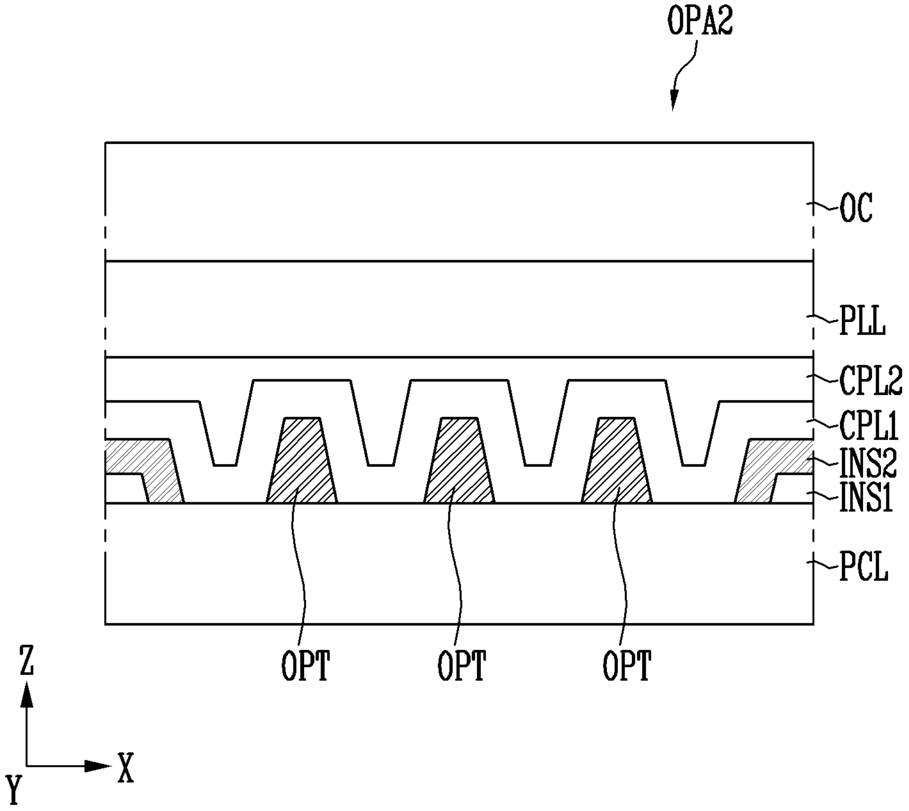

FIG. 11 is a schematic cross-sectional view illustrating first to third pixels according to an embodiment. FIGS. 12 to 14 are schematic cross-sectional views of a pixel according to embodiments. FIGS. 15 to 17 are schematic cross-sectional views of an opening area according to embodiments.

FIG. 11 illustrates a partition wall or bank WL, a color conversion layer CCL, an optical layer OPL, and/or a color filter layer CFL that are provided on the pixel circuit layer PCL and the light-emitting element layer LEL of the pixel PXL, described above with reference to FIGS. 7 and 8.

FIGS. 12 to 14 illustrate embodiments of the pixel PXL in relation to the pixel circuit layer PCL, the light-emitting element layer LEL, the bank WL, the color conversion layer CCL, the optical layer OPL, and/or the color filter layer CFL.

FIGS. 15 to 17 illustrate embodiments of the second opening area OPA2 in relation to the pixel circuit layer PCL, the bank WL, the color conversion layer CCL, the optical layer OPL, and/or the color filter layer CFL. In FIGS. 15 to 17, for convenience of description, the pixel layer PCL is schematically illustrated, and a detailed description thereof is omitted.

Referring to FIGS. 11 and 12, the bank WL may be disposed on the light-emitting element layer LEL for the first to third pixels PXL1, PXL2, and PXL3. For example, the bank WL may be disposed between the first to third pixels PXL1, PXL2, and PXL3 or at a boundary therebetween, and may include openings respectively overlapping the first to third pixels PXL1, PXL2, and PXL3. The openings in the bank WL may provide spaces in which the color conversion layer CCL may be provided.

The bank WL may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the bank WL may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

In accordance with an embodiment, the bank WL may include at least one light blocking and/or reflective material. Accordingly, light leakage between adjacent pixels PXL may be prevented. For example, the bank WL may include at least one black matrix material and/or color filter material. In an embodiment, the bank WL may be formed as a black opaque pattern that is capable of blocking the penetration of light. In an embodiment, a reflective layer (not illustrated) or the like may be formed on the surface (e.g., sidewall) of the bank WL in order to improve the light efficiency of each pixel PXL.

The bank WL may overlap the above-described bank BNK in a third direction (e.g., Z axis direction). In an embodiment, the bank WL may be directly disposed on the bank BNK. The color conversion layer CCL may be disposed on the light-emitting element layer LEL including light-emitting elements LD in the openings in the bank WL. The color conversion layer CCL may include a first color conversion layer CCL1 disposed on the first pixel PXL1, a second color conversion layer CCL2 disposed on the second pixel PXL2, and a scattering layer LSL disposed on the third pixel PXL3.

In an embodiment, the first to third pixels PXL1, PXL2, and PXL3 may include light-emitting elements LD which emit light of the same color. For example, the first to third pixels PXL1, PXL2, and PXL3 may include light-emitting elements LD which emit light of a third color (e.g., blue). The color conversion layers CCL including color conversion particles may be disposed on the first to third pixels PXL1, PXL2, and PXL3, thus displaying a full-color image.

The first color conversion layer CCL1 may include first color conversion particles which convert light of a third color emitted from the light-emitting elements LD into light of a first color. For example, the first color conversion layer CCL1 may include multiple first quantum dots QD1 dispersed in a matrix material such as base resin.

In an embodiment, in case that the light-emitting element LD is a blue light-emitting element for emitting blue light and the first pixel PXL1 is a red pixel, the first color conversion layer CCL1 may include first quantum dots QD1, which convert blue light emitted from the blue light-emitting element into red light. The first quantum dots QD1 may absorb blue light and shift the wavelength of the blue light depending on energy transition, thus emitting red light. In case that the first pixel PXL1 is a pixel of another color, the first color conversion layer CCL1 may include first quantum dots QD1 corresponding to the color of the first pixel PXL1.

The second color conversion layer CCL2 may include second color conversion particles which convert light of a third color emitted from the light-emitting elements LD into light of a second color. For example, the second color conversion layer CCL2 may include multiple second quantum dots QD2 dispersed in a matrix material such as base resin.

In an embodiment, in case that the light-emitting element LD is a blue light-emitting element for emitting blue light and the second pixel PXL2 is a green pixel, the second color conversion layer CCL2 may include second quantum dots QD2, which convert blue light emitted from the blue light-emitting element into green light. The second quantum dots QD2 may absorb blue light and shift the wavelength of the blue light depending on energy transition, thus emitting green light. In case that the second pixel PXL2 is a pixel of another color, the second color conversion layer CCL2 may include second quantum dots QD2 corresponding to the color of the second pixel PXL2.

In an embodiment, blue light having a relatively short wavelength in a visible light range may be incident on the first quantum dots QD1 and on second quantum dots QD2, and thus the absorption coefficient of the first quantum dots QD1 and the second quantum dot QD2 may be increased. The efficiency of light emission from the first pixel PXL1 and the second pixel PXL2 may be improved while excellent color reproducibility may be secured. Further, the emission parts EMU (shown in FIG. 4) of the first to third pixels PXL1, PXL2, and PXL3 may be implemented using light-emitting elements LD of the same color (e.g., blue light-emitting elements), thus improving the efficiency of manufacture of the display device.

The scattering layer LSL may be provided so as to efficiently use light of a third color (or a blue color) emitted from the light-emitting elements LD. For example, in case that the light-emitting element LD is a blue light-emitting element which emits blue light, and the third pixel PXL3 is a blue pixel, the scattering layer LSL may include at least one type of scatterers SCT so as to efficiently utilize the light emitted from the light-emitting element LD.

For example, the scattering layer LSL may include multiple scatterers SCT distributed in a certain matrix material, such as base resin. For example, the scattering layer LSL may include scatterers SCT such as silica, but the constitution of the scatterers SCT is not limited thereto. The scatterers SCT are not necessarily disposed only on the third pixel PXL3, and may be selectively included in the first color conversion layer CCL1 or the second color conversion layer CCL2. In accordance with an embodiment, the scatterers SCT may be omitted, and a scattering layer LSL formed of a transparent polymer may be provided.

A first capping layer CPL1 may be disposed on the color conversion layer CCL. The first capping layer CPL1 may be provided throughout the first to third pixels PXL1, PXL2, and PXL3. The first capping layer CPL1 may cover the color conversion layer CCL. The first capping layer CPL1 may prevent impurities such as moisture or air from externally penetrating into the color conversion layer CCL and from damaging or polluting the color conversion layer CCL.

The first capping layer CPL1 may be an inorganic layer, and may include silicon nitride (SiNx), aluminum nitride (AlNx), titanium nitride (TiNx), silicon oxide (SiOx), aluminum oxide (AlOx), a titanium oxide (TiOx), silicon oxycarbide (SiOxCy), or silicon oxynitride (SiOxNy).

An optical layer OPL may be disposed on the first capping layer CPL1. The optical layer OPL may function to recycle light provided from the color conversion layer CCL through total reflection, thus improving light emission efficiency. By means of this operation, the optical layer OPL may have a refractive index lower than that of the color conversion layer CCL. For example, the refractive index of the color conversion layer CCL may be about 1.6 to about 2.0, and the refractive index of the optical layer OPL may be about 1.1 to about 1.3.

A second capping layer CPL2 may be disposed on the optical layer OPL. The second capping layer CPL2 may be provided throughout the first to third pixels PXL1, PXL2, and PXL3. The second capping layer CPL2 may cover the optical layer OPL. The second capping layer CPL2 may prevent impurities such as moisture or air from externally penetrating into the optical layer OPL and from damaging or polluting the optical layer OPL.

The second capping layer CPL2 may be an inorganic layer, and may include silicon nitride (SiNx), aluminum nitride (AlNx), a titanium nitride (TiNx), silicon oxide (SiOx), aluminum oxide (AlOx), titanium oxide (TiOx), silicon oxycarbide (SiOxCy), or silicon oxynitride (SiOxNy).

A planarization layer PLL may be disposed on the second capping layer CPL2. The planarization layer PLL may be provided throughout the first to third pixels PXL1, PXL2, and PXL3.

The planarization layer PLL may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the planarization layer PLL may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A color filter layer CFL may be disposed on the planarization layer PLL. The color filter layer CFL may include a first color filter, a second color filter, and a third color filter CF1, CF2, and CF3 each matching the colors of respective pixels PXL. Color filters CF1, CF2, and CF3 matching respective colors of the first to third pixels PXL1, PXL2, and PXL3 may be disposed, and thus a full-color image may be displayed.

The color filter layer CFL may include a first color filter CF1, which is disposed in the first pixel PXL1 to selectively transmit light emitted from the first pixel PXL1, a second color filter CF2, which is disposed in the second pixel PXL2 to selectively transmit light emitted from the second pixel PXL2, and a third color filter CF3, which is disposed in the third pixel PXL3 to selectively transmit light emitted from the third pixel PXL3.

In an embodiment, the first color filter CF1, the second color filter CF2, and the third color filter CF3 may be, but are not limited to, a red color filter, a green color filter, and a blue color filter, respectively. Hereinafter, in case that an arbitrary color filter is designated among the first color filter CF1, the second color filter CF2, and the third color filter CF3 or in case that two or more types of color filters are comprehensively designated, the color filter or color filters may be designated as "color filter CF" or "color filters CF."

The first color filter CF1 may overlap the light-emitting element layer LEL (or the light-emitting element LD) and the first color conversion layer CCL1 of the first pixel PXL1 in a third direction (e.g., Z axis direction). The first color filter CF1 may include a color filter material which selectively transmits light of a first color (or red). For example, in case that the first pixel PXL1 is a red pixel, the first color filter CF1 may include a red color filter material.

The second color filter CF2 may overlap the light-emitting element layer LEL (or the light-emitting element LD) and the second color conversion layer CCL2 of the second pixel PXL2 in the third direction (e.g., Z axis direction). The second color filter CF2 may include a color filter material which selectively transmits light of a second color (or green). For example, in case that the second pixel PXL2 is a green pixel, the second color filter CF2 may include a green color filter material.

The third color filter CF3 may overlap the light-emitting element layer LEL (or the light-emitting element LD) and the scattering layer LSL of the third pixel PXL3 in the third direction (e.g., Z axis direction). The third color filter CF3 may include a color filter material which selectively transmits light of a third color (or blue). For example, in case that the third pixel PXL3 is a blue pixel, the third color filter CF3 may include a blue color filter material.

In accordance with an embodiment, a light blocking layer BM may be further disposed between the first to third color filters CF1, CF2, and CF3. In this way, in case that the light blocking layer BM is formed between the first to third color filters CF1, CF2, and CF3, a visually perceptible compound color failure on the front surface or the side surface of the display device may be prevented. The material of the light blocking layer BM is not particularly limited, and the light blocking layer BM may be formed of various light-blocking materials. For example, the light blocking layer BM may be implemented such that the first to third color filters CF1, CF2, and CF3 are layered stacked each other.

An overcoat layer OC may be disposed on the color filter layer CFL. The overcoat layer OC may be provided throughout the first to third pixels PXL1, PXL2, and PXL3. The overcoat layer OC may cover lower elements including the color filter layer CFL. The overcoat layer OC may prevent moisture or air from penetrating into the above-described lower elements. Furthermore, the overcoat layer OC may protect the above-described lower elements from impurities such as dust.

The overcoat layer OC may include an organic material such as acrylic resin, epoxy resin, phenolic resin, polyamide resin, polyimide resin, polyester resin, polyphenylenesulfide resin, or benzocyclobutene (BCB). However, the disclosure is not limited thereto, and the overcoat layer OC may include various types of inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In an embodiment, the display device may further include a separate substrate facing the light-emitting element layer LEL. For example, as illustrated in FIGS. 13 and 14, an upper base layer UBSL may be further disposed on the light-emitting element layer LEL.

Referring to FIG. 13, the above-described bank WL, color conversion layer CCL, first capping layer CPL1, optical layer OPL, and/or second capping layer CPL2 may be sequentially provided on the light-emitting element layer LEL. The above-described light blocking layer BM and color filter layer CFL may be provided on a surface of the upper base layer UBSL. For example, the light blocking layer BM may be disposed between the upper base layer UBSL and the color filter layer CFL, but the disclosure is not limited thereto.

The upper base layer UBSL may be coupled to the light-emitting element layer LEL through an intermediate layer CTL. In an embodiment, the intermediate layer CTL may be disposed between the color filter layer CFL of the upper base layer UBSL and the second capping layer CPL2 of the base layer BSL, but is not limited thereto.

The intermediate layer CTL may be a transparent adhesive, for example, an optically clear adhesive layer (or adhesion layer), for strengthening an adhesive force between the light-emitting element layer LEL and the upper base layer UBSL, but the disclosure is not limited thereto. In accordance with an embodiment, the intermediate layer CTL may include a filler formed of an insulating material having insulation properties and adhesive properties.

In an embodiment, the upper base layer UBSL may form an encapsulation substrate and/or a window member of the display device. The upper base layer UBSL may be a rigid or flexible substrate, and the materials or properties thereof are not particularly limited. The upper base layer UBSL may be formed of a material identical to or different from that of the base layer BSL.

Referring to FIG. 14, the above-described light blocking layer BM, color filter layer CFL, optical layer OPL, second capping layer CPL2, bank WL, color conversion layer CCL, and/or first capping layer CPL1 may be sequentially provided on one surface of the upper base layer UBSL. The upper base layer UBSL may be coupled to a light-emitting element layer LEL through the intermediate layer CTL. In an embodiment, the intermediate layer CTL may be disposed between the first capping layer CPL1 of the upper base layer UBSL and the light-emitting element layer LEL of the base layer BSL, but the disclosure is not limited thereto.

Referring to FIG. 15, the above-described color conversion layer CCL, first capping layer CPL1, optical layer OPL, second capping layer CPL2, planarization layer PLL, color filter layer CFL, and/or overcoat layer OC may be further disposed in a second opening area OPA2. The color conversion layer CCL, the first capping layer CPL1, the optical layer OPL, the second capping layer CPL2, the planarization layer PLL, the color filter layer CFL, and/or the overcoat layer OC may be sequentially provided on organic patterns OPT in the second opening area OPA2. However, the disclosure is not limited thereto, and the color conversion layer CCL and/or the optical layer OPL may be omitted in the second opening area OPA2, as illustrated in FIG. 16, or the color conversion layer CCL, the optical layer OPL, and/or the color filter layer CFL may be omitted, as illustrated in FIG. 17. Furthermore, as described above with reference to FIGS. 13 and 14, the upper base layer UBSL, instead of the overcoat layer OC, may be provided.

Below, a method of manufacturing a display device according to an embodiment will be described.

FIGS. 18 to 25 are schematic cross-sectional views illustrating respective processing steps in a method of manufacturing a display device according to an embodiment. FIGS. 18 to 25 are schematic cross-sectional views for explaining the method of manufacturing the display device based on FIGS. 8 to 10, wherein the same reference numerals are used to designate the substantially same components as those in FIGS. 8 and 10 and detailed reference numerals are omitted.

Figure 18:
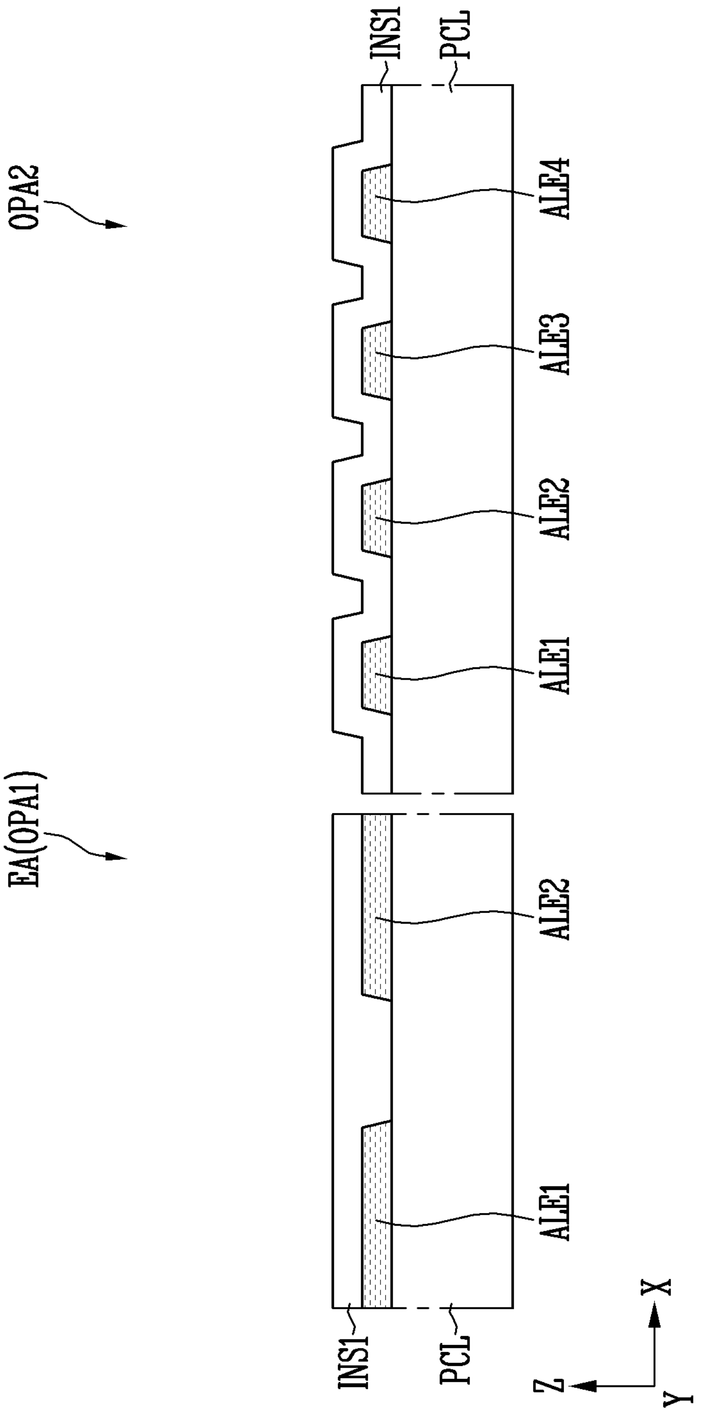
FIGS. 18 to 25 are schematic cross-sectional views illustrating respective processing steps in a method of manufacturing a display device according to an embodiment.

Referring to FIG. 18, electrodes ALE spaced apart from each other may be formed on a pixel circuit layer PCL, and a first insulating layer INS1 may be formed on the electrodes ALE. The first insulating layer INS1 may be formed on the entire surface of the pixel circuit layer PCL.

Figure 19:
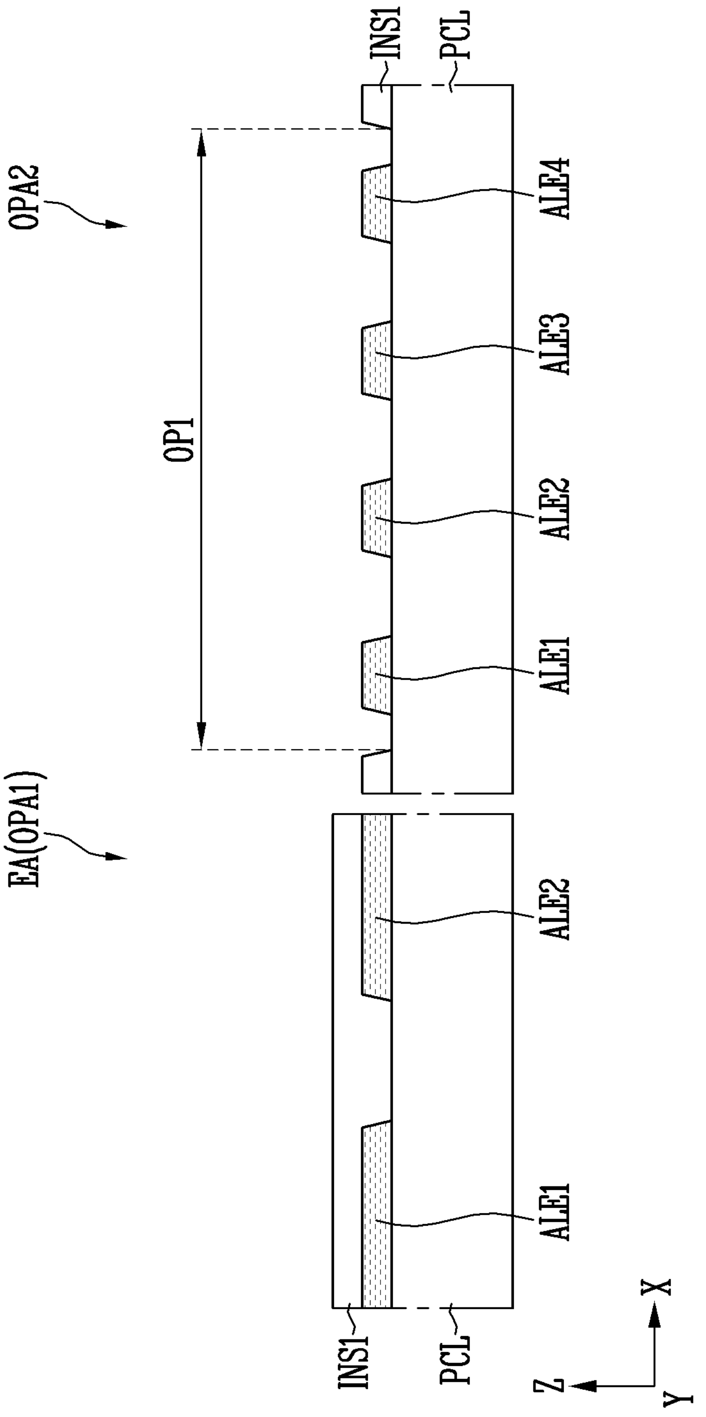

Referring to FIG. 19, a first opening OP1 may be formed in a second opening area OPA2 by etching the first insulating layer INS1. The first opening OP1 may at least partially expose the electrodes ALE disposed in the first opening OP1.

Figure 20:
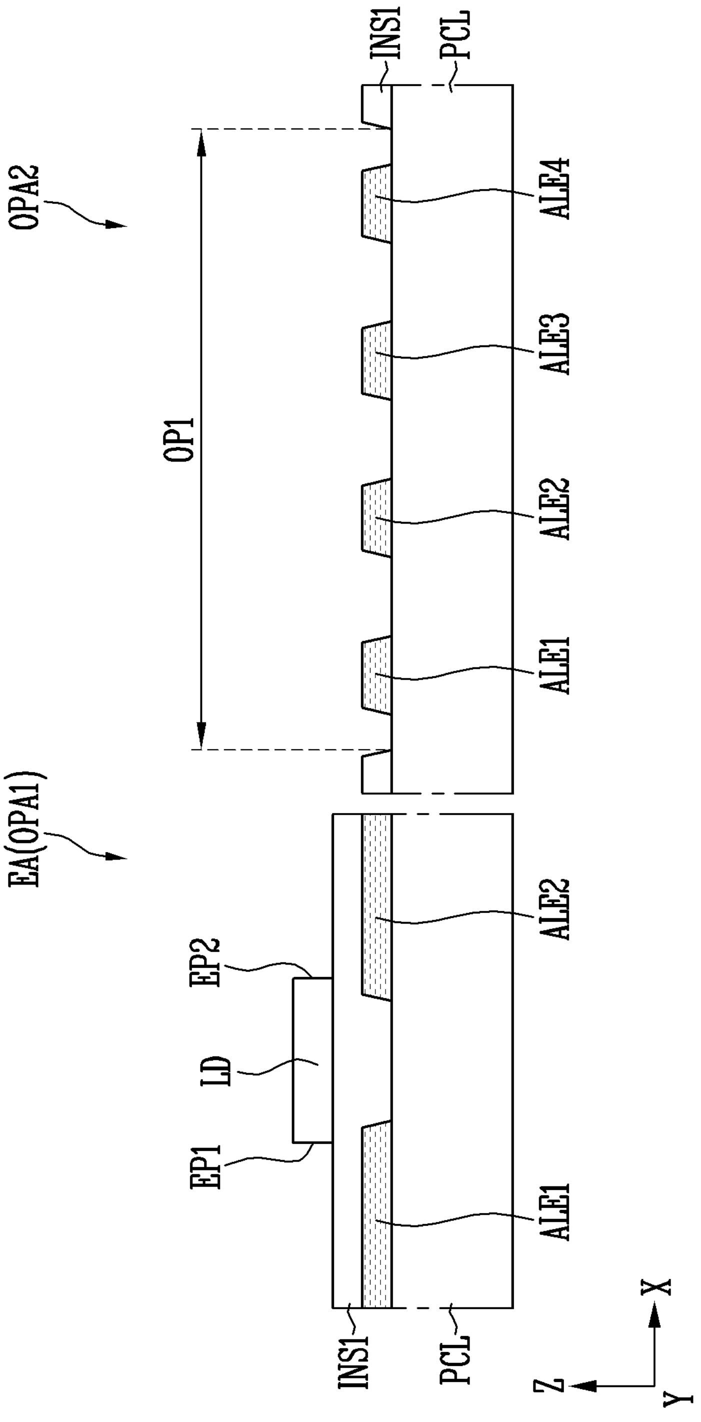

Referring to FIG. 20, light-emitting elements LD may be provided between the electrodes ALE in an emission area EA. The light-emitting elements LD may be aligned between the electrodes ALE while being disposed on the first insulating layer INS1. The light-emitting elements LD may be prepared in a form dispersed in light-emitting element ink and provided to each of the pixels PXL using an ink jet printing method or the like. In an embodiment, the light-emitting elements LD may be dispersed in a volatile solvent and provided to each of the pixels PXL. In case that an alignment signal is supplied to the electrodes ALE, an electric field may be formed between the electrodes ALE, and thus the light-emitting elements LD may be aligned between the electrodes ALE. After the light-emitting elements LD have been aligned, the solvent may be volatilized or removed using other additional methods, and thus the light-emitting elements LD may be stably arranged between the electrodes ALE.

Figure 21:
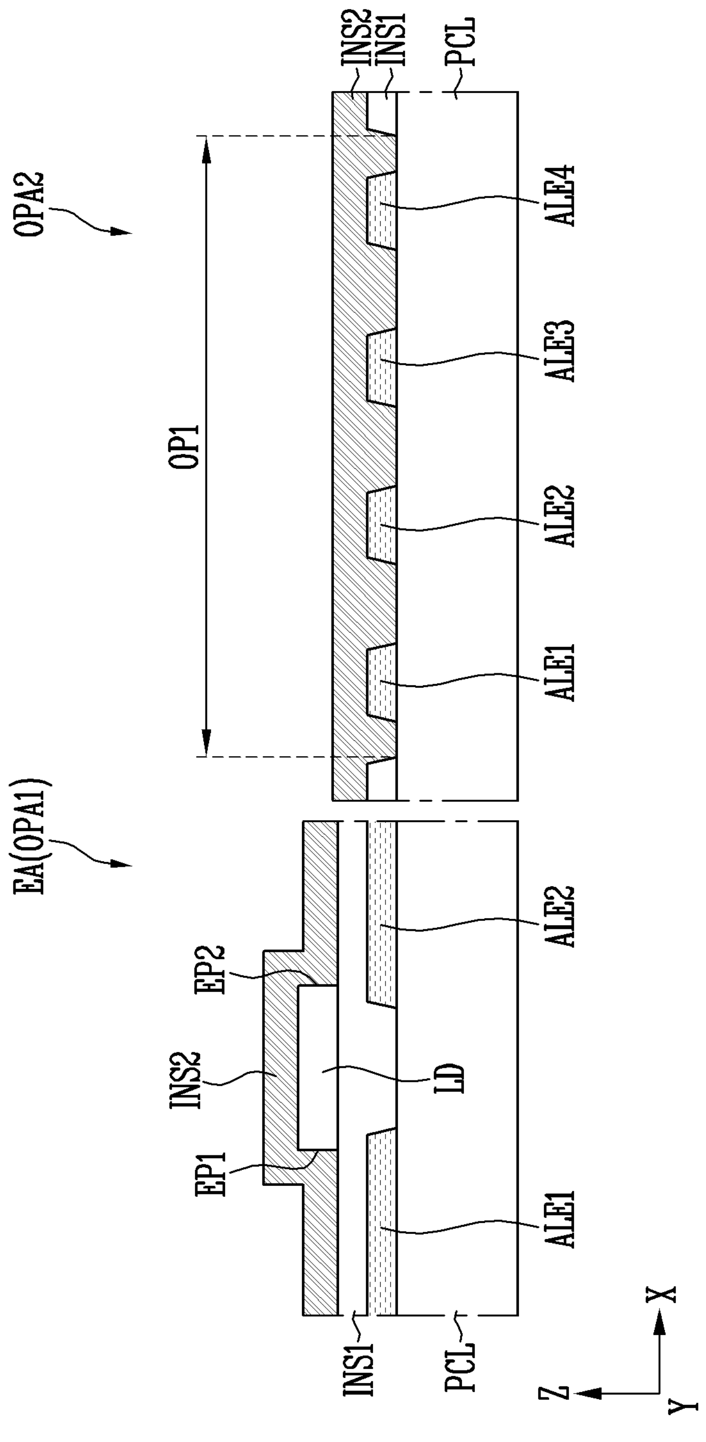

Referring to FIG. 21, a second insulating layer INS2 may be formed on the electrodes ALE, the light-emitting elements LD, and/or the first insulating layer INS1. The second insulating layer INS2 may be formed on the light-emitting elements LD and the first insulating layer INS1 in the emission area EA. Also, the second insulating layer INS2 may be formed on the electrodes ALE exposed through the first opening OP1 in the first insulating layer INS1 in the second opening area OPA2. The second insulating layer INS2 may be formed on the entire surface of the pixel circuit layer PCL.

Figure 22:
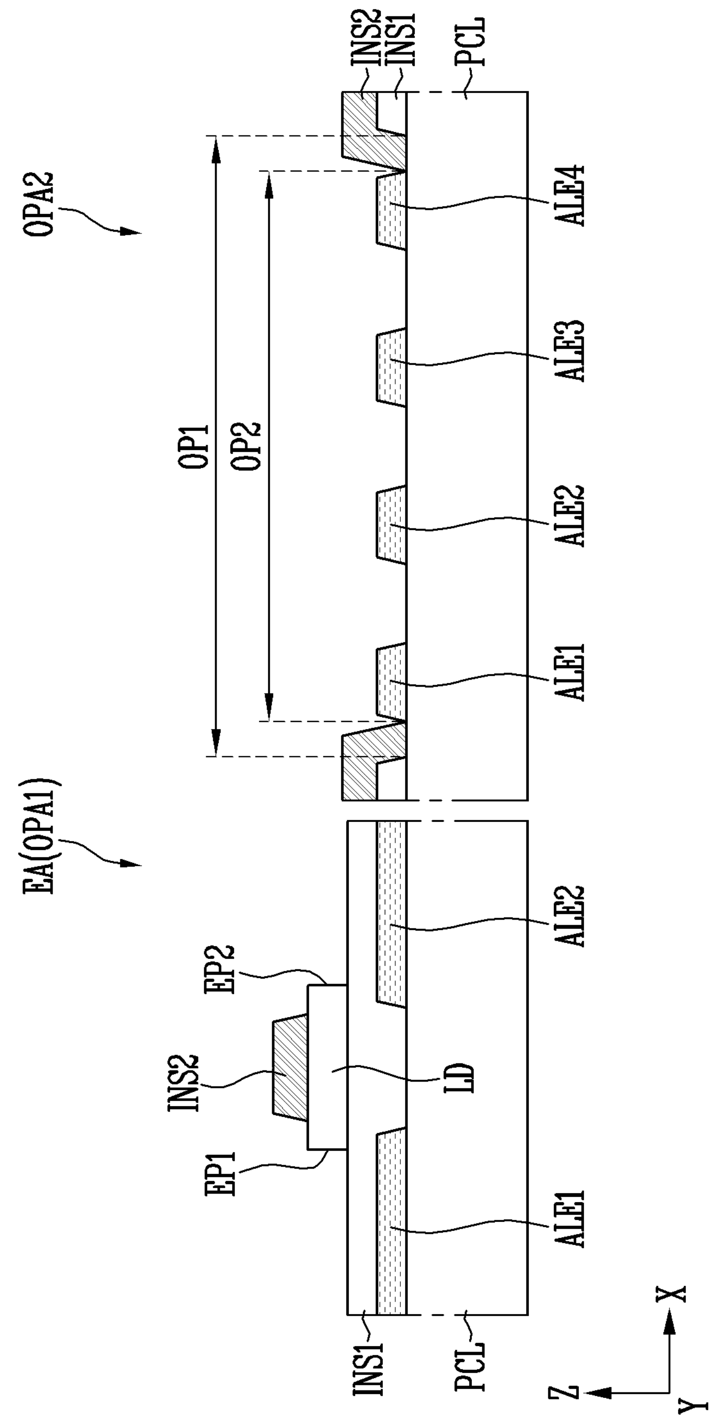

Referring to FIG. 22, a second opening OP2 may be formed in the second opening area OPA2 by etching the second insulating layer INS2. The second opening OP2 in the second insulating layer INS2 may be formed to overlap the first opening OP1 in the first insulating layer INS1. The second opening OP2 may at least partially expose the electrodes ALE disposed in the second opening OP2. Further, in the process of etching the second insulating layer INS2, first and second ends EP1 and EP2 of the light-emitting elements LD may be exposed.

Figure 23:
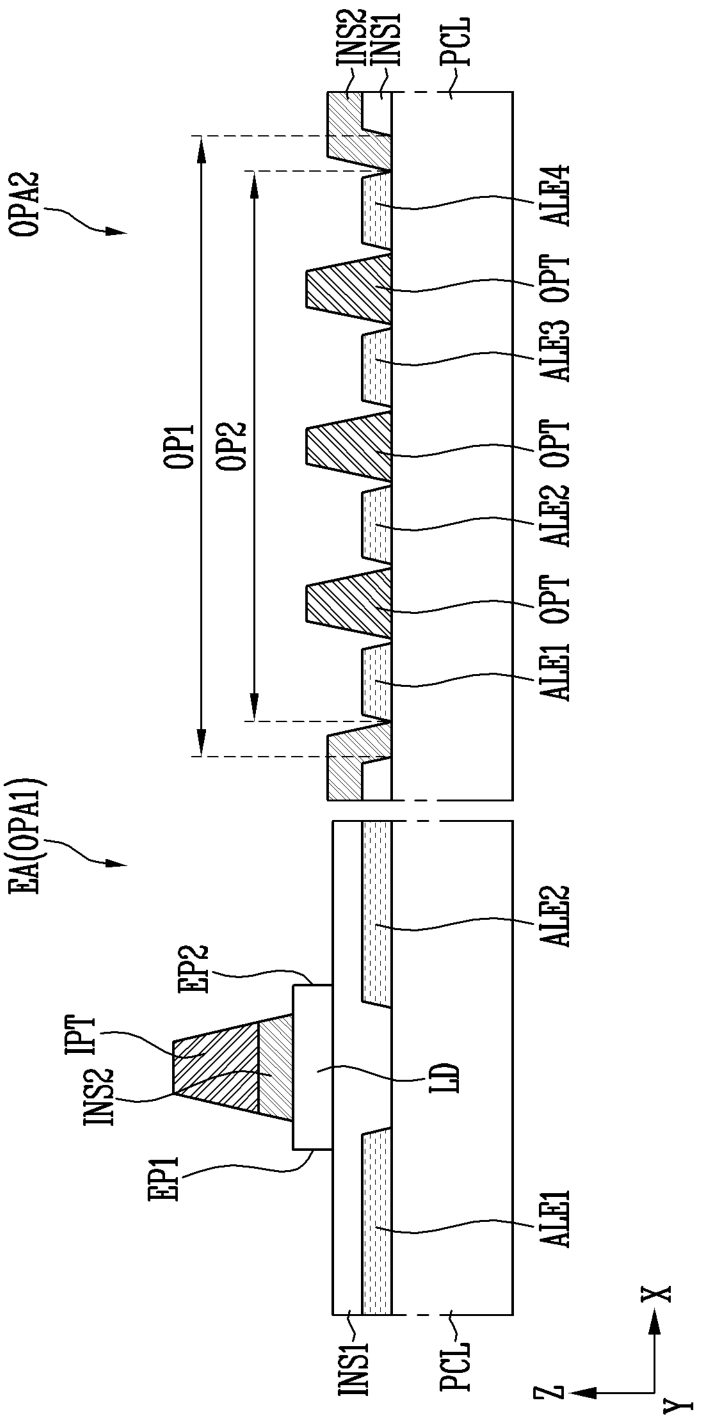

Referring to FIG. 23, an insulating pattern IPT and organic patterns OPT may be formed. The insulating pattern IPT and the organic patterns OPT may be simultaneously formed in the same process, thereby reducing the number of masks and simplifying a manufacturing process.

The insulating pattern IPT may be formed on the second insulating layer INS2, and may expose the first and second ends EP1 and EP2 of the light-emitting elements LD. The organic patterns OPT may be formed in the first opening OP1 in the first insulating layer INS1 and/or the second opening OP2 in the second insulating layer INS2. The organic patterns OPT may be formed to be spaced apart from each other in a first direction (e.g., X axis direction). The organic patterns OPT may be formed between the electrodes ALE. For example, adjacent organic patterns OPT may be spaced apart from each other with at least one electrode ALE interposed therebetween.

Figure 24:
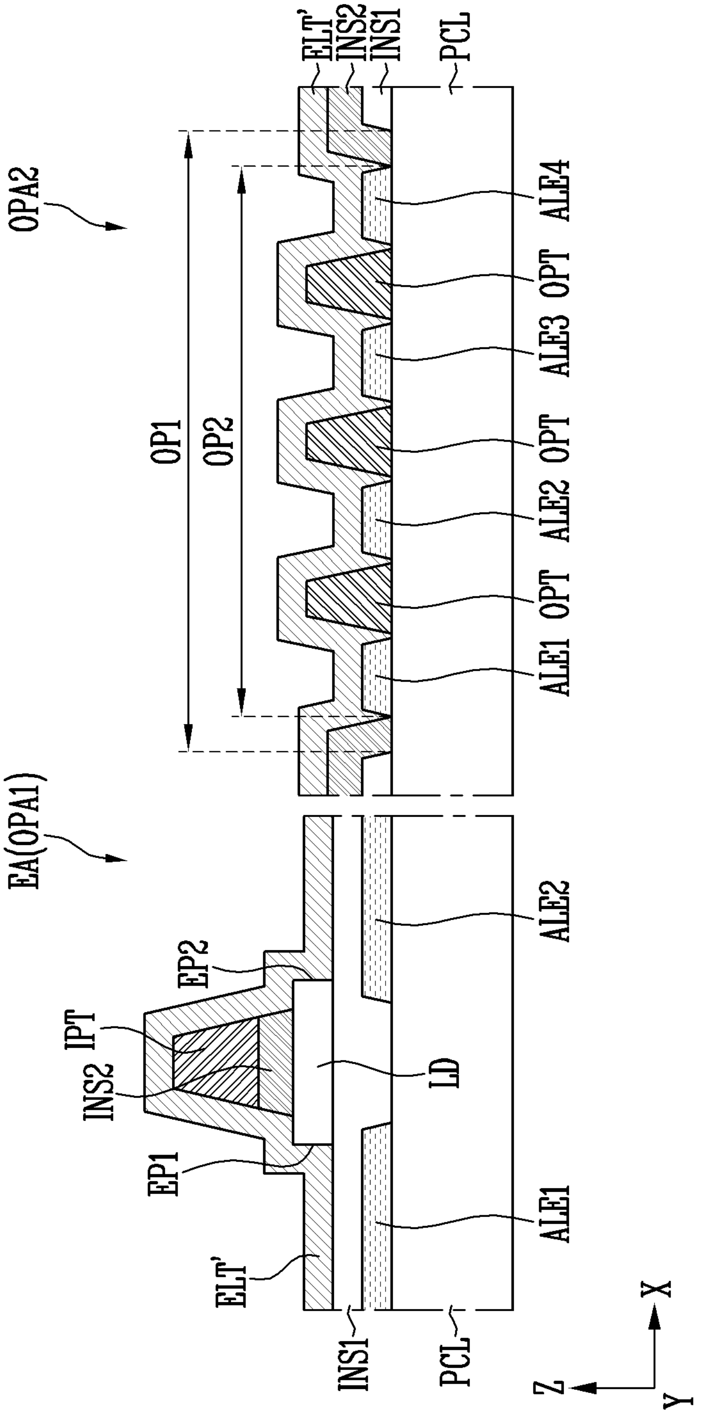

Referring to FIG. 24, a connection electrode layer ELT' may be formed on the light-emitting elements LD, the insulating pattern IPT, and/or the organic patterns OPT. The connection electrode layer ELT' may be formed on the entire surface of the pixel circuit layer PCL. The connection electrode layer ELT' may be formed of various types of transparent conductive materials. In an embodiment, the connection electrode layer ELT' may include at least one of various transparent conductive materials, such as indium tin oxide (ITO), indium zinc oxide (IZO), indium tin zinc oxide (ITZO), aluminum zinc oxide (AZO), gallium doped zinc oxide (GZO), zinc tin oxide (ZTO), and gallium tin oxide (GTO), and may be implemented to be substantially transparent or translucent so as to satisfy a specific transmissivity.

Figure 25:
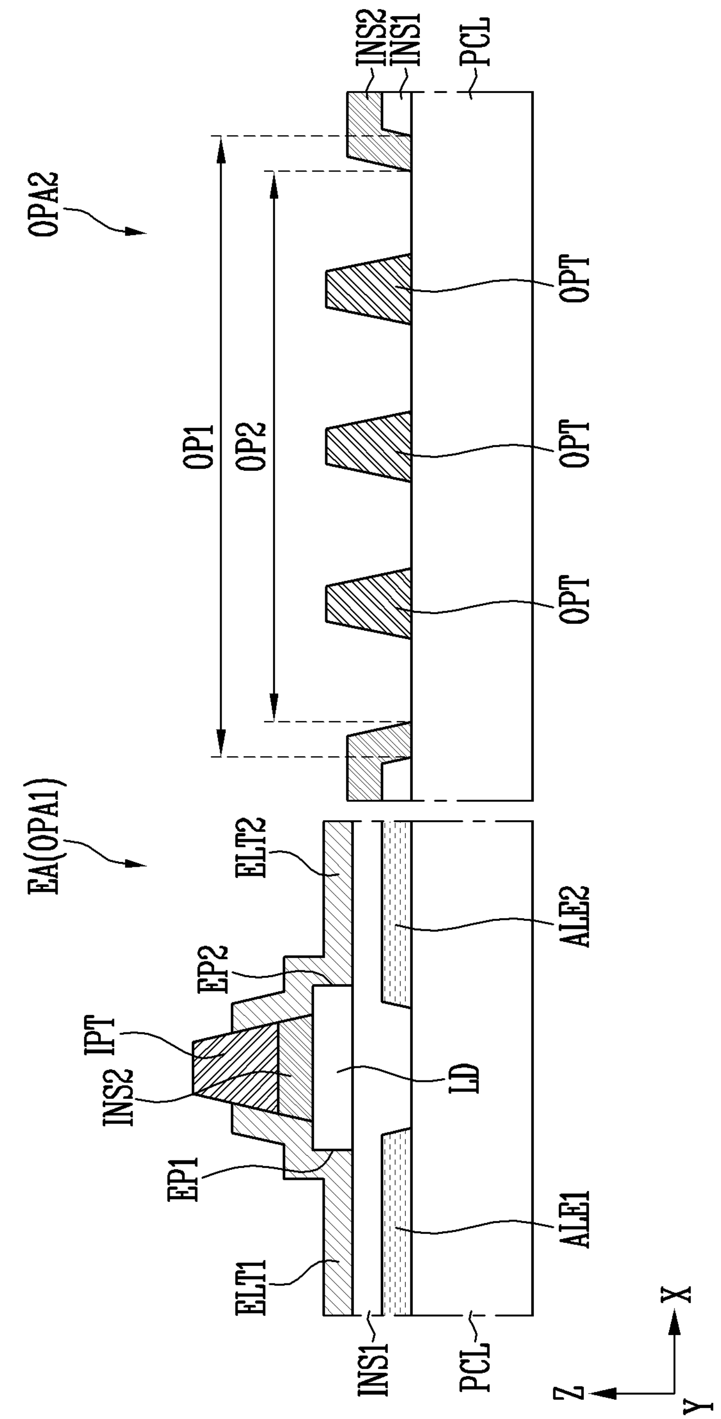

Referring to FIG. 25, the connection electrode layer ELT' and/or the electrodes ALE may be partially removed. The connection electrode layer ELT' formed on the insulating pattern IPT in the emission area EA may be partially removed, and may be separated into a first connection electrode ELT1 located on the first end EP1 of each light-emitting element LD and a second connection electrode ELT2 located on the second end EP2 of the light-emitting element LD. For example, the connection electrode layer ELT' may be separated using the height of the insulating pattern IPT, thus enabling the connection electrodes ELT to be simultaneously formed, and the number of masks may be reduced. Furthermore, the organic patterns OPT formed in the second opening area OPA2 may be disposed between the electrodes ALE to locally compensate for height differences, and thus the connection electrode layer ELT' formed over the electrodes ALE in the second opening area OPA2 may be stably etched. Therefore, in the second opening area OPA2, especially in the second opening OP2 in which the electrodes ALE are disconnected, short-circuit failures in the electrodes ALE attributable to residue in the connection electrode layer ELT' may be prevented.

After the portion of connection electrode layer ELT' is removed from the second opening area OPA2, the electrodes ALE exposed through the second opening OP2 may be removed. After the alignment of the light-emitting elements LD is completed, the electrodes ALE may be disconnected in the second opening area OPA2 corresponding to a non-emission area NEA, especially in the second opening OP2, thereby enabling the pixels PXL to be formed to be individually driven.

In accordance with embodiments of the disclosure, connection electrodes may be separated and simultaneously formed using height differences between insulating patterns, and thus the number of masks may be reduced. Further, because connection electrodes may be stably removed by forming organic patterns in an opening in which electrodes are disconnected, short-circuit failures in the electrodes attributable to residue in the connection electrodes may be prevented. Furthermore, organic patterns and an insulating pattern may be simultaneously formed in the same process, and thus the process of manufacturing a display device may be simplified.

The effects according to the embodiments are not limited to the foregoing descriptions, and various effects not described herein may fall within the scope of the specification.

It will be understood by those skilled in the art to which the disclosure pertains that the embodiments may be implemented in modified forms without departing from the essential features of the disclosure. Therefore, the disclosed methods should be considered to be illustrative rather than restrictive. The scope of the disclosure is described in the accompanying claims rather than in the detailed description, and all changes, equivalents or modifications included in the spirit and scope of the disclosure should be construed as falling within the scope of the disclosure.

What is claimed is:

1. A display device, comprising:

electrodes spaced apart from each other;

a first insulating layer disposed on the electrodes and including a first opening;

a light-emitting element disposed on the first insulating layer and disposed between adjacent ones of the electrodes;

organic patterns disposed between adjacent ones of the electrodes and spaced apart from the light emitting element in a plan view in the first opening;

a second insulating layer disposed on the light-emitting element in a plan view; and an insulating pattern disposed on the second insulating layer and overlapping the light-emitting element in the plan view, such that the second insulating layer is between the insulating pattern and the light-emitting element, wherein the insulating pattern exposes a first end and a second end of the light-emitting element.

2. The display device according to claim 1, wherein the second insulating includes a second opening overlapping the first opening in the plan view.

3. The display device according to claim 2, wherein the organic patterns are spaced apart from each other in a first direction in the second opening.

4. The display device according to claim 3, wherein each of the organic patterns extends in a second direction intersecting the first direction.

5. The display device according to claim 2, wherein the second opening is offset from the electrodes in the plan view.

6. The display device according to claim 1, wherein the organic patterns and the insulating pattern include a same material.

7. The display device according to claim 1, further comprising:

a first connection electrode disposed on the first end of the light-emitting element; and a second connection electrode disposed on the second end of the light-emitting element.

8. The display device according to claim 7, wherein the first connection electrode and the second connection electrode are disposed on a same layer.

* * * * *